(12) United States Patent
Maharyta et al.

(10) Patent No.: US 12,381,569 B2
(45) Date of Patent: Aug. 5, 2025

(54) CURRENT-MODE ANALOG-TO-DIGITAL CONVERTER SYSTEMS, DEVICES AND METHODS FOR MULTI-SENSING

(71) Applicant: Cypress Semiconductor Corporation, San Jose, CA (US)

(72) Inventors: Andriy Maharyta, Lviv (UA); Oleksandr Karpin, Lviv (UA); Paul Walsh, Cork (IE); Mark Healy, County Cork (IE)

(73) Assignee: Cypress Semiconductor Corporation, San Jose, CA (US)

( * ) Notice: Subject to any disclaimer, the term of this patent is extended or adjusted under 35 U.S.C. 154(b) by 230 days.

(21) Appl. No.: 17/314,998

(22) Filed: May 7, 2021

(65) Prior Publication Data
US 2022/0360275 A1 Nov. 10, 2022

(51) Int. Cl.
*H03M 1/34* (2006.01)
*G01D 5/14* (2006.01)
*G01R 17/02* (2006.01)

(52) U.S. Cl.
CPC .............. *H03M 1/34* (2013.01); *G01D 5/14* (2013.01); *G01R 17/02* (2013.01)

(58) Field of Classification Search
CPC ...... H03M 3/43; H03M 3/456; H03M 1/1245; H03M 3/458; G01R 27/2605; G06F 3/0446; G06F 3/044; H03K 2217/960725; H03K 17/962
See application file for complete search history.

(56) References Cited

U.S. PATENT DOCUMENTS

| | | | |
|---|---|---|---|
| 8,570,053 B1 * | 10/2013 | Ryshtun | H03K 17/962 324/683 |
| 8,836,669 B1 * | 9/2014 | Ogirko | G06F 3/04162 326/38 |
| 10,162,467 B2 * | 12/2018 | Maharyta | G06F 3/04182 |
| 2018/0260076 A1 * | 9/2018 | Maharyta | G06F 3/0446 |
| 2019/0227669 A1 * | 7/2019 | Maharyta | G06F 3/0443 |
| 2020/0284651 A1 * | 9/2020 | Theiler | G01J 1/4228 |

* cited by examiner

*Primary Examiner* — Patrick C Chen

(57) ABSTRACT

A device can include analog circuits formed with a substrate, including a comparator, analog switches, and a balance current circuit. A sensor current and balance current can be applied at an input of the comparator. The sensor current, balance current or both can be modulated with a switch control signal. Digital circuits can include switch control logic that generates the switch control signal in response to an output of the comparator and a modulation clock signal. Digital signal processing circuits can generate a multi-bit digital value from a bit stream output by the comparator circuit. The multi-bit digital value can be an analog-to-digital conversion of the sensor current. Corresponding methods and systems are also disclosed.

21 Claims, 28 Drawing Sheets

Ph0

Ph1

Ph2

Ph3

Ph0

Ph1

(BACKGROUND)

(BACKGROUND)

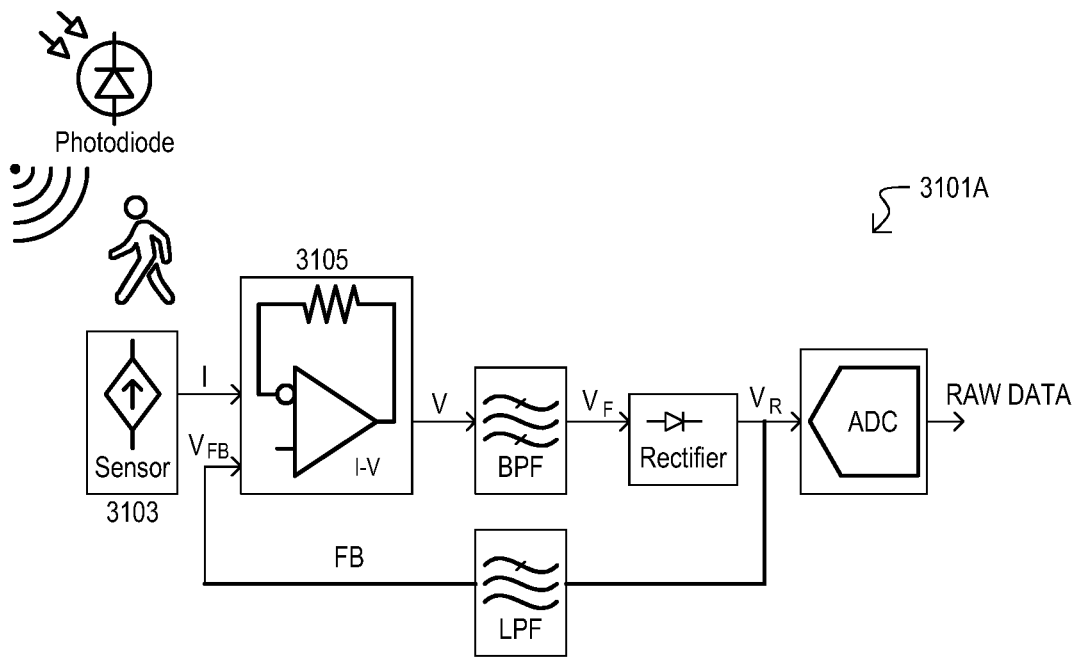
FIG. 31A (BACKGROUND)
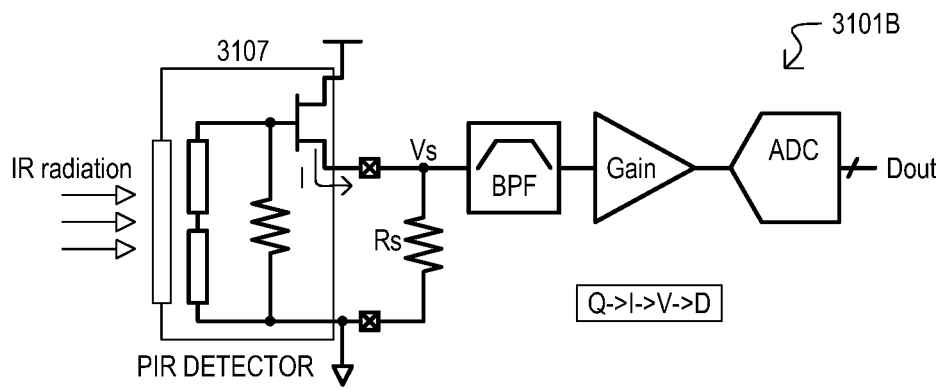
FIG. 31B (BACKGROUND)
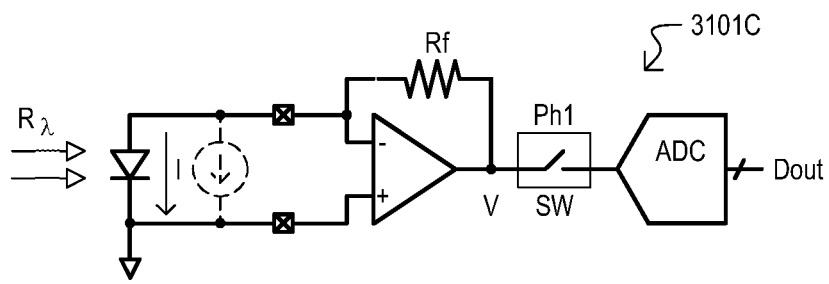
FIG. 31C (BACKGROUND)

CURRENT-MODE ANALOG-TO-DIGITAL CONVERTER SYSTEMS, DEVICES AND METHODS FOR MULTI-SENSING

TECHNICAL FIELD

The present disclosure relates generally to analog-to-digital converters (ADCs), and more particularly to ADCs configurable to operate with a variety of different sensor types.

BACKGROUND

Conventional analog-to-digital converters (ADCs) are used in a wide number of applications, including sensor systems. FIGS. 30A and 30B are schematic diagrams of conventional sensor systems 3001A and 3001B. Sensor systems 3001A/B can include a sensor resistance Rsa/Rsb, which can vary according to a sensor response, in series with a fixed resistance Rd. A reference voltage source Vref can result in the generation of a measured voltage Vxa/Vxb by voltage division across the resistances Rs/Rd. A voltage mode ADC circuit can convert the measured voltage Vxa/Vxb into a digital value (RAW DATA). Typically, the ADC can use the same reference voltage Vref in the conversion operation. In the case of FIG. 30A, a sensor resistance value Rsa can be given by the following:

$$Vxa = \frac{Rsa}{Rd + Rsa} \cdot Vref \quad Rsa = \frac{Vxa}{Vref - Vxa} \cdot Rd$$

In the case of FIG. 30B, a sensor resistance Rsb can be given by the following:

$$Vxb = \frac{Rd}{Rd + Rsb} \cdot Vref \quad Rsb = \left(\frac{Vref}{Vxb} - 1\right) \cdot Rd$$

Accordingly, a sensed resistance Rsa/Rsb is non-linear with respect to the Vx value. As a result, a sensitivity of a system depends on the sensor resistance Rsa/Rsb.

A drawback to resistive divider approaches like those of FIGS. 30A and 30B can be the non-linearity between a sensed resistance and converted voltage value; the necessity of a reference voltage; limitations in dynamic range due to the resistance divider; and the waste of static current through the resistance divider.

FIGS. 31A to 31C show various examples of conventional photoelectric and pyroelectric sensing systems. FIG. 31A shows a photoelectric sensing system 3101A. A sensor, such as one based on a photodiode, can serve as a current source 3103 which generates a current (I) that can vary according to a sensor operation. An amplifier stage 3105 can generate a sense voltage (V) from the current (I). A sense voltage (V) can be filtered with a bandpass filter (BPF) to generate a filtered voltage $V_F$. Filtered voltage $V_F$ can be applied to a rectifier to generate a rectified voltage $V_R$. Rectified voltage $V_R$ can be applied to an ADC circuit to generate a conversion (i.e., digital) output (RAW DATA). The rectified voltage $V_R$ can be applied to a low pass filter (LPF) and serve as a feedback voltage to amplifier stage 3105.

FIG. 31B shows a conventional passive infrared (PIR) sensor system 3101B. A PIR detector 3107 can generate a current (I) in response to IR radiation. A sensor system 3101B can include a sensor resistance Rs which can generate a sense voltage Vs in response to sensor current (I). A sense voltage Vs can be filtered with a BPF, and the resulting voltage amplified with a gain stage (Gain). A voltage ADC circuit can convert the amplified voltage into a digital value (Dout). System 3101B can be conceptualized as converting a light generated charge (Q) into a current (I) into a voltage (V) into a digital value (D).

FIG. 31C shows a conventional photodetector system 3101C. Light (Rλ) detected by a photodiode can generate a current (I). Current (I) can be input to an amplifier stage which can generate a voltage (V). Voltage (V) can be sampled/modulated (SW) before being converted into a digital output value Dout by ADC. System 3101C can be conceptualized as converting a current (I) into a voltage (V) into a digital value (D).

Conventional sensor systems, like those described herein, can include an intermediate stage to convert a sensor current into a sensed voltage, such as a transimpedance amplifier (TIA), integrator, or passive element structure. The sensed voltage is then be converted into a digital value by a voltage ADC (V-ADC).

A drawback to conventional approaches like those of FIGS. 31A to 31C can be complexity and expense.

It would be desirable to arrive at an ADC system that does not suffer from drawbacks of conventional approaches.

BRIEF DESCRIPTION OF THE DRAWINGS

FIG. 31A to 31C are diagrams showing conventional sensor systems with voltage ADCs.

DETAILED DESCRIPTION

Figure 1:
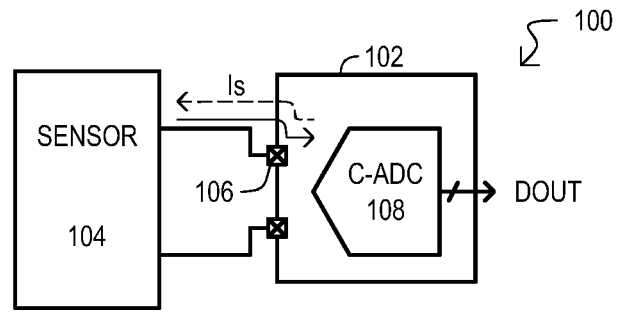
FIG. 1 is a block diagram of a sensor system according to an embodiment.

Embodiments can include a current-mode analog-to-digital converter (C-ADC) that can serve as a common architecture for a wide range of different sensing methods and sensor types. According to embodiments, a C-ADC can execute conversions, such resistance-to-code inversions, with an architecture that is relatively insensitive to current source, power supply and reference voltage variations, unlike conventional approaches. Any variety of current based sensing types can be accommodated, including but not limited to: capacitance sensing, inductance sensing, and resistance sensing. Sensing can be single ended or differential.

According to embodiments, a C-ADC can include an analog comparator that generates an output bit stream based on an input that can vary according to a sensor current. When the analog comparator input exceeds a threshold, the analog comparator output can transition varying the bit stream. The effect of the sensor current at an input of the comparator can be balanced by a balance current.

In some embodiments, a sensor current can be modulated in response to an analog comparator bit stream output.

In some embodiments, a balance current can be modulated in response to an analog comparator bit stream output. In some embodiments, a balance current can be generated with a switched capacitor circuit.

In the various embodiments described herein, like items are referred to by the same reference characters, but with the leading digit(s) corresponding to the figure number.

FIG. 1 is a block diagram of a system 100 according to an embodiment. A system 100 can include an ADC section 102 that can receive a sensor current (Is) from a sensor device 104. A sensor current (Is) can be received as an input through a physical connection 106. A direction of a sensor current (Is) can vary according to application and the type of sensor device 104. In some embodiments, ADC section 102 includes a C-ADC circuit 108 that does not include any intermediate circuit for a current-to-voltage conversion, and thus can directly receive a sensor current (Is). In this way, a C-ADC system 100 can be less complex and/or costly than conventional approaches.

Figure 2A:
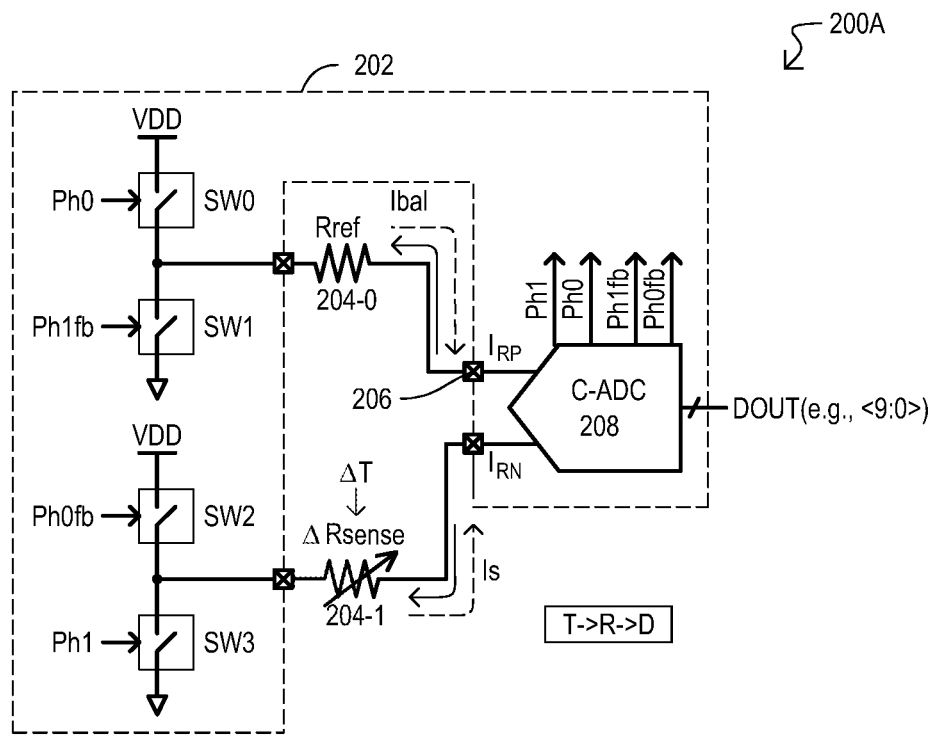
FIGS. 2A to 2D are block diagrams of sensor systems according to other embodiments.

FIG. 2A to 2D are diagrams showing various sensing systems according to embodiments. According to embodiments, a same C-ADC system can be employed in multiple different sensor applications. FIG. 2A shows a temperature sensing system 200A according to an embodiment. A system 200A can include a sensor resistance Rsense 204-1, a reference resistance Rref 204-0, and an ADC section 202. A sensor resistance 204-1 can vary in resistance in response to changes in temperature (T). A reference resistance 204-0 can be selected based on an expected range of sensor resistance 204-1.

ADC section 202 can include C-ADC circuit 208 and switches SW0 to SW3. C-ADC circuit 208 can generate switch control signals Ph0, Ph1, Ph0$fb$ and Ph1$fb$. Switch control signal Ph0 can turn switch SW0 on when in an active state. Switch control signal Ph1 can turn switch SW3 on when at an active level (e.g., high). Switch control signals Ph0$fb$ and Ph1$fb$ can turn on switches SW2 and SW1, respectively, when in an active state. Control signals Ph0/Ph1 have active levels that do not overlap in time. Further, switch control signals Ph0/Ph1 will vary (e.g., frequency) according to an expected sensor current (Is). Switch control signals Ph0$fb$/Ph1$fb$ can be modulated according to a feedback loop within C-ADC circuit 208 as Is increases and/or decreases. According to embodiments, as switches SW2/SW3 operate to generate a sensor current (Is), switches SW0/SW1 can generate a balance current (Ibal) that counteracts the effect of Is at the input of C-ADC circuit 208. It is understood that the various switch control signals Ph0/Ph0$fb$/Ph1/Ph1$fb$ can vary according to the current flow direction of Is and Ibal.

In response to currents sensed at a first input ($I_{RP}$) and a second input ($I_{RN}$), C-ADC circuit 208 can generate a digital output value DOUT. DOUT can include any suitable number of bits, and in the embodiment shown, includes 10-bits. In some embodiments, ADC section 202 can form part of a same integrated circuit device having external connections (one shown as 206) to reference and sensor resistances 204-0/1. A system 200A can be conceptualized as converting a temperature (T) into a resistance (R) into a digital value (D).

Figure 2B:
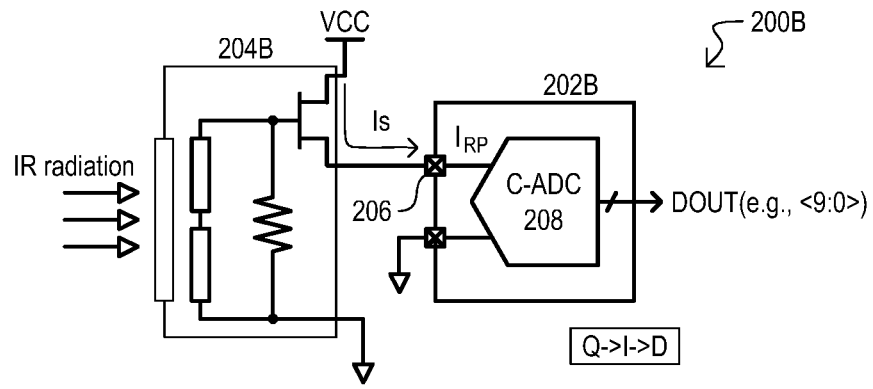

FIG. 2B shows a passive infrared (PIR) sensing system 200B according to an embodiment. A system 200B can include a PIR sensor 204B and an ADC section 202B. In response to incident IR radiation, a PIR sensor 204B can generate a sensor current (Is). Sensor current (Is) can be received as an input current $I_{RP}$ via an external connection 206, and provided to a C-ADC circuit 208. According to embodiments, unlike a conventional PIR sensing system, a sensor current (Is) does not flow through a resistor to be converted into a sense voltage. In some embodiments, a sensor current (Is) can be directly received by C-ADC circuit 208 for conversion into a digital output value DOUT. DOUT can be any suitable multi-bit value, and in the embodiment shown, can include 10-bits. A system 200B can be conceptualized as converting a light-induced charge (Q) into a current (I) into a digital value (D).

Figure 2C:
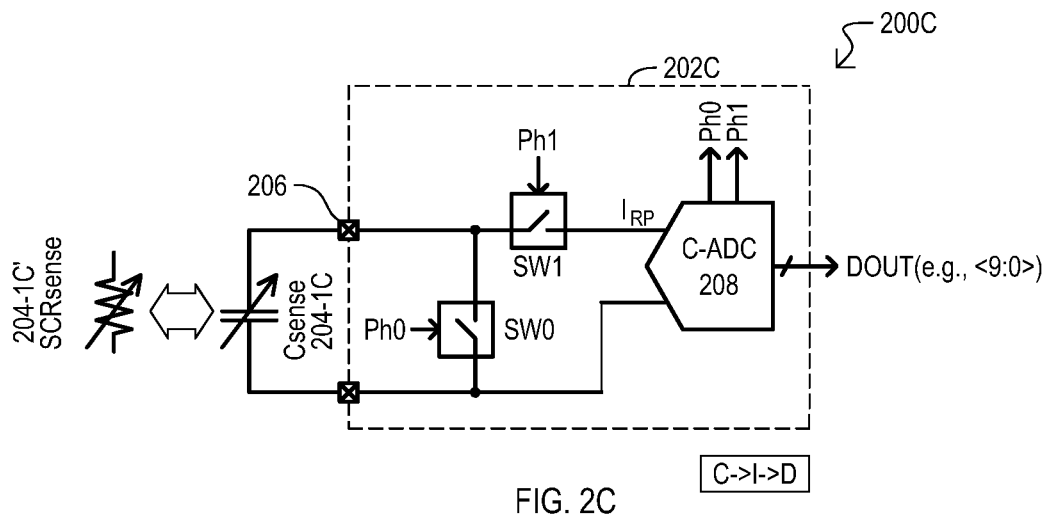

FIG. 2C shows a self-capacitance sensing system 200C according to an embodiment. A system 200C can include a sense capacitance 204-1C (or 204-1C') and ADC section 202C. A sense capacitance 204-1C can vary in response to external events (e.g., proximity of an object). While a sense capacitance 204-1C can take the form of a capacitor with a dielectric, embodiments can include any suitable structure that provides a variation in capacitance, such as a switched capacitor resistor (SCR), as but one of many possible examples.

ADC section 202C can include C-ADC circuit 208 and switches SW0 and SW1. C-ADC circuit 208 can generate switch control signals Ph0 and Ph1 for controlling SW0 and SW1, respectively. Control signals Ph0/Ph1 can have active levels that do not overlap in time, and can vary (e.g., frequency, duty cycle) according to an expected sensor current (Is). In response to a current sensed at an input ($I_{RP}$), C-ADC circuit 208 can generate a digital output value DOUT. In some embodiments, ADC section 202 can form part of a same integrated circuit device having external connections (one shown as 206). A system 200C can be conceptualized as converting a capacitance (C) into a current (I) into a digital value (D).

Figure 2D:
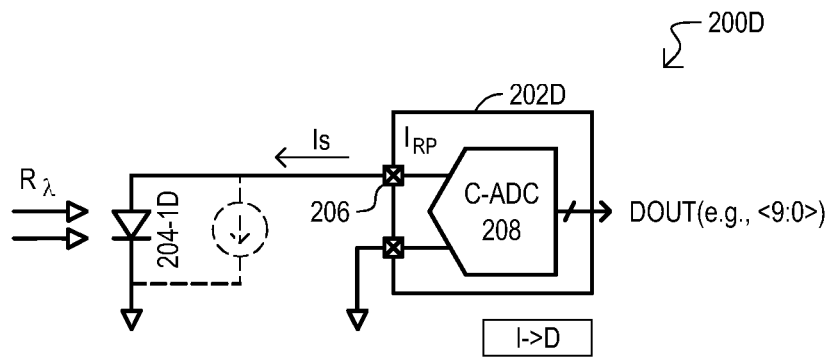

FIG. 2D shows a photoelectric sensing system 200D according to an embodiment. A system 200D can include a photoelectric device 204-1D and an ADC section 202D. In response to incident light of predetermined wavelengths, photoelectric device 204-1D can function as a current source and generate a sensor current (Is). A photoelectric device 204-1D can be any suitable device that generates current in response to light, including but not limited to a photodiode or phototransistor. Sensor current (Is) can be received as an input current $I_{RP}$ via an external connection 206. According to embodiments, unlike a conventional photoelectric sensing system, a sensor current (Is) is not applied to a voltage conversion stage (e.g., TIA). In some embodiments, a sensor current (Is) can be directly received by C-ADC circuit 208 for conversion into a digital output value DOUT. A system 200D can be conceptualized as converting a current (I), essentially directly, into a digital value (D).

Referring still to FIGS. 2A to 2D, in some embodiments an ADC section (202, 202B, 202C, 202D) can be the same current sensing architecture, adaptable to the various different systems. This is in contrast to conventional approaches that can include circuits designed for one application. In some embodiments, an ADC section (202, 202B, 202C, 202D) can include configurable circuits for enabling different analog signal paths between circuit sections and/or enabling different digital signal processing and signal timing to meet the needs of a desired application.

While FIGS. 2A to 2D show particular applications, embodiments can include various other sensor types that generate a current output signal or rely on resistance sensing. Embodiments with sensors that generate current output can include a pyroelectric sensor or an electret type sensor (e.g., electret microphone), as but two examples. Such current sensing embodiments can combine amplification and quantization in one conversion operation. This is in contrast to conventional approaches which include separate pre-amplifier prior to quantization. Embodiments with resistance sensing can also include temperature sensors (both negative and positive dependence), resistive force sensors, resistive pressure sensors, resistive touch sensors (e.g., touchpad, button). Such resistance sensing embodiments can include a direct resistance-to-code conversion with a phased switching architecture. This is in contrast to conventional approaches which convert a resistance to a sense voltage, and then apply the sense voltage to a voltage ADC.

Figure 3:
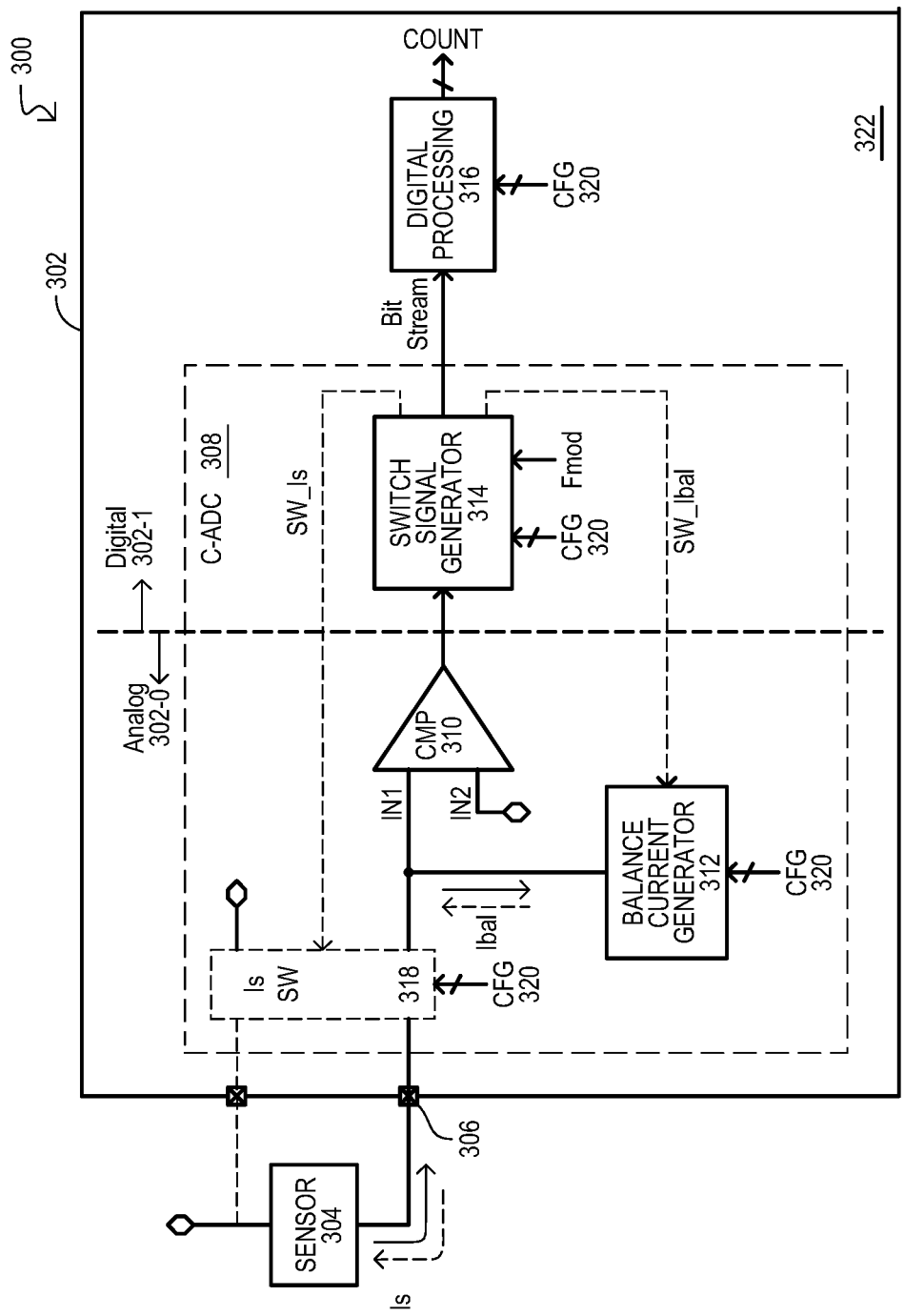
FIG. 3 is a block schematic diagram of a current analog-to-digital converter (C-ADC) circuit according to an embodiment.

FIG. 3 is a diagram of a sensor system 300 according to an embodiment. A system 300 can include an ADC section 302 and a sensor 304. A sensor 304 can be any suitable sensor as described herein and equivalents. A sensor 304 can generate, or be charged and/or biased to generate, a sensor current (Is). A sensor current (Is) can flow from a sensor 304, into a sensor 304, or both in different phases of a sensing operation.

An ADC section 302 can include an analog section 302-0 and a digital section 302-1. An analog section 302-0 can include an analog comparator 310 and can include (or be configured to include) a balance current generator 312. In some embodiments, an analog section 302-0 can include a sense switching section 318. In some embodiments, ADC section 302 can be formed in an integrated circuit (IC) substrate 322. An analog comparator 310 can have an input (IN1) connected to receive a sensor current (Is) and an output connected to switch signal generator 314. A balance current generator 312 can generate a balance current Ibal. A balance current Ibal can flow in a direction opposite to that of sensor current (Is) with respect to input (IN1). In some embodiments, a balance current generator 312 can be modulated according to one or more balance switch control signals SW_Ibal.

In some embodiments, a sensor current (Is) can directly flow into or out of comparator input IN1. However, in other embodiments a sense switching section 318 can selectively connect a sensor current (Is) to analog comparator 310. In some embodiments, a sense switching section 318 can selectively connect a sensor 304 to a power supply in response to sense switch control signals SW_Is. Such a feature can enable a sensor current (Is) to modulated.

A digital section 302-1 can include a switch signal generator 314 and digital processing circuits 316. A switch signal generator 314 can generate switch control signals SW_Ibal and/or SW_Is in response to an output of analog comparator 310 and a modulation clock Fmod. An output of switch signal generator 314 can be a bit stream that varies according to a sensor current (Is). Digital processing circuits 316 can process a bit stream to generate a multi-bit output value COUNT.

A C-ADC circuit 308 can include analog comparator 310, balance current generator 312, switch signal generator 314, and optionally sense switch section 318. In some embodiments, C-ADC circuit 308 can be one version of those shown in FIGS. 1 to 2D.

In some embodiments, various portions of ADC section 302 can be configurable according to configuration inputs 320. Configuration inputs 320 can be provided from a configuration data stored in a memory (not shown). In some embodiments, switch elements within balance current generator 312 and sensor current switching section 318 can be connected in various configurations based on configuration inputs 320. A magnitude of a current provided by balance current generator 312 can be established by configuration inputs 320. A switch signal generator 314 can be configured based on configuration inputs 320. A switch signal generator 314 can include various digital blocks (e.g., flip-flops, other logic gates) interconnected based on configuration inputs 320. In addition or alternatively, programmable logic can be configured with configuration inputs 320 to form all or part of switch signal generator 314.

FIGS. 4A to 4D are schematic diagrams of capacitance sense architectures 400A/B according to embodiments that can convert a sensor current into an output bit stream, which can be subsequently converted into multi-bit digital values. In some embodiments, systems 400A or 400B can be implementations of system 300.

Figure 4B:
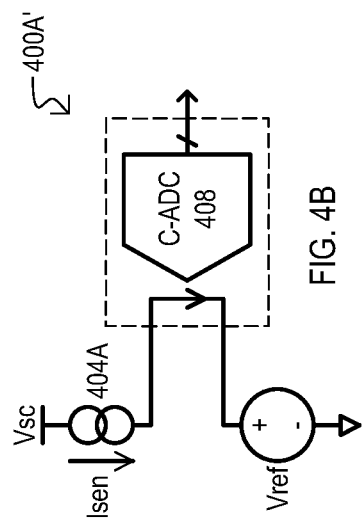
FIGS. 4A to 4D are schematic diagram of current sensing systems according to embodiments.
Figure 4D:
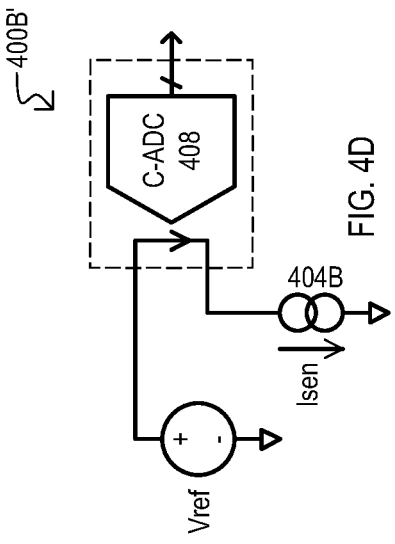
Figure 4A:
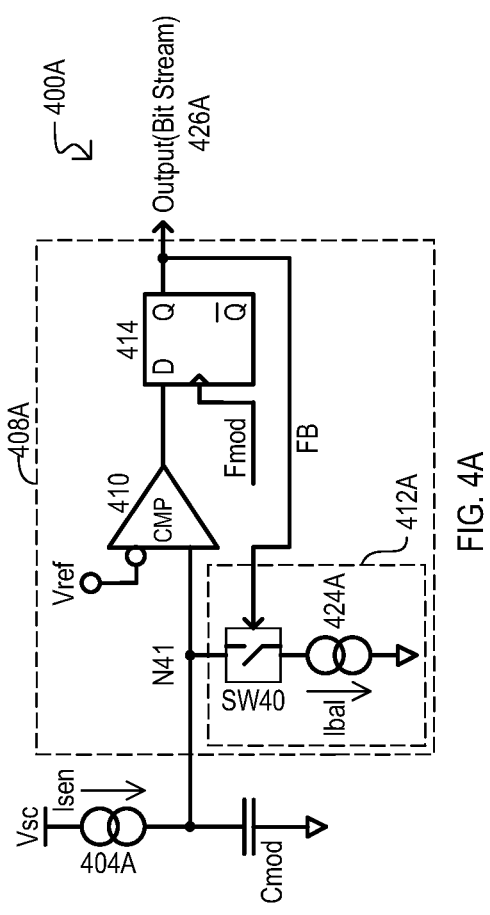

FIG. 4A shows a source current measurement system 400A that includes a sensor current source 404A, a modulation capacitance Cmod, and a C-ADC circuit 408A. A sensor current source 404A can correspond to a current generated by a sensor device. A modulation capacitance Cmod can be connected in series with sensor current source 404A at input node N41. A value of Cmod can be selected based on an expected sensor current.

A C-ADC circuit 404A can include an analog comparator 410, a balance current generator 412A, and a switch signal generator 414. Analog comparator 410 can have a first (+) input connected to node N41 and a second input (−) connected to a reference voltage Vref. A balance current generator 412A can include a current source 424A in series with a switch SW40 between node N41 and a low power supply node. In some embodiments, a current source 424A can be programmable with configuration data, or the like. Switch SW40 can be controlled according to a feedback signal FB. A switch signal generator 414 can include a D-Q type flip-flop (FF) 414 having an input (D) connected to an output of comparator 410, an output (Q) 426A that provides an output bit stream and serves as feedback signal FB. FF 414 can be clocked according to a periodic modulation clock signal Fmod.

In operation, as a sensor current Isen charges modulation capacitance Cmod, a voltage at node N41 can rise. When the voltage exceeds Vref, an analog comparator 410 output can go high. As a result, FF output 426A can transition high. This can cause a balance current Ibal to discharge node N41 by operation of switch SW40. Once node N41 is discharged below Vref, an analog comparator 410 output can go low causing FF output 426A to transition low. This can stop balance current Ibal at node N41, enabling the Cmod to charge in response to Isen. The process can repeat as a sensor current Isen continues to flow. According to the magnitude of sensor current Isen, a bit stream 426A duty cycle can vary. FIG. 4B is a diagram of a system 400A' showing a simplified representation of the system of FIG. 4A.

Figure 4C:
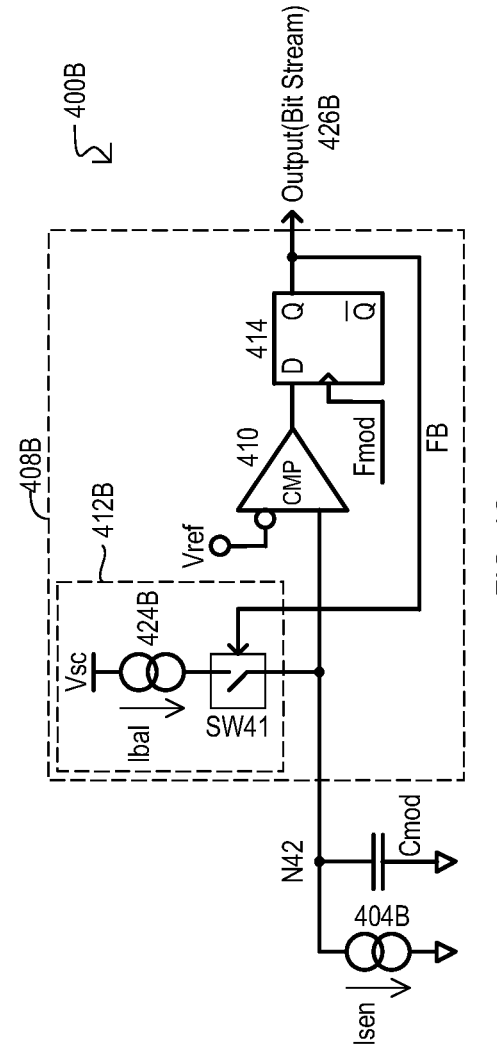

FIG. 4C shows a sink current measurement system 400C that includes a sink current source 404B, a modulation capacitance Cmod, and a C-ADC circuit 408B. A system 400C can operate in a similar fashion to FIG. 4A. A system 400C can differ from that of FIG. 4A in that a sensor current Isen can discharge Cmod while a balance current generator 412B can charge Cmod. FIG. 4D is a diagram of a system 400B' showing a simplified representation of that shown in FIG. 4C.

In the embodiments of FIGS. 4A and 4C a maximum sensor current Isen can be lower than a balance current Ibal. A supply voltage Vsc can be higher than a reference voltage Vref.

A transfer function for the systems 400A and 400C can be given as:

$$Dx = \frac{1}{Ibal} \cdot Isen$$

where Dx is a conversion result (e.g., digital value).

Figure 5A:
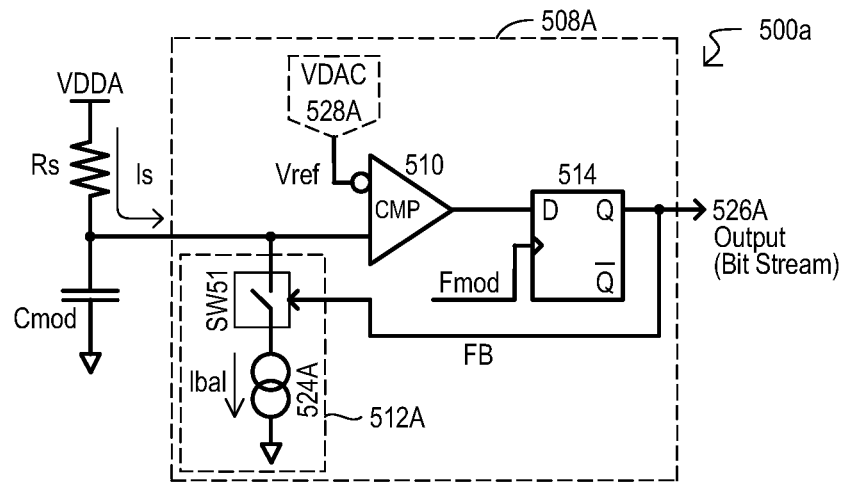
FIGS. 5A and 5B are schematic diagram of resistance sensing ADC systems according to embodiments.
Figure 5B:
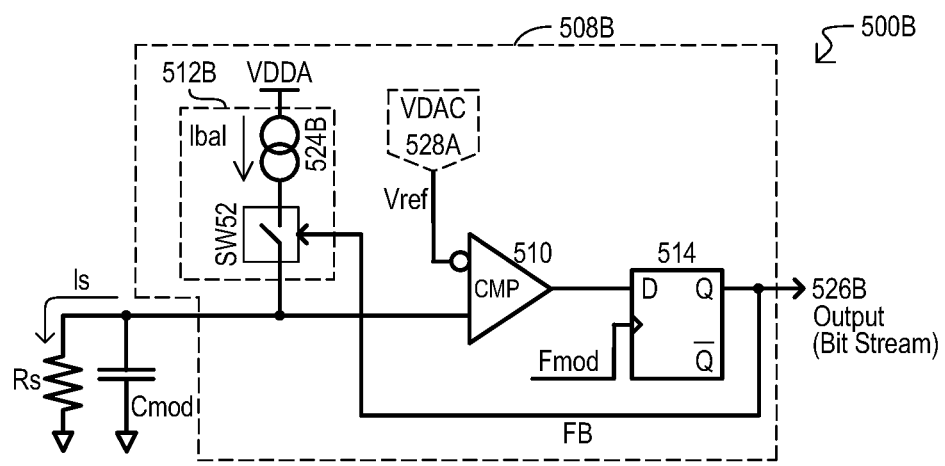

FIGS. 5A and 5B show how the current-to-digital conversion architecture of FIGS. 4A and 4C can be applied to resistance measurement applications, according to embodiments. FIGS. 5A and 5B have the same configuration as FIGS. 4A and 4C respectively, but with a sensor resistance Rs in place of a sensor current source 404A/B. Current sources 524A/B can be any of: a constant current source, a digitally programmable current source (iDAC), a resistance or a programmable resistance set.

A transfer function of the conversions of FIGS. 5A and 5B can be given by:

$$Dx = \frac{VDDA - Vref}{Ibal} \cdot \frac{1}{Rs} \quad \text{(FIG. 5A)}$$

$$Dx = \frac{Vref}{Ibal} \cdot \frac{1}{Rs} \quad \text{(FIG. 5B)}$$

The embodiments of FIGS. 5A and 5B can operate optimally under the conditions:

$$\frac{VDDA - Vref}{Rs_{min}} < Ibal \quad \text{(FIG. 5A)}$$

$$\frac{Vref}{Rs_{min}} < Ibal \quad \text{(FIG. 5B)}$$

where $Rs_{min}$ is a minimum resistance of Rs.

If a maximum sensor current (Is) is higher than a maximum balance current Ibal, a reference voltage Vref can be adjusted. Accordingly, in some embodiments a reference voltage Vref can be changed with a voltage digital-to-analog converter (VDAC) 528A/B. However, in other embodiments a modulation switch can be included in series with a sensor resistance Rs, to further control Is. Such embodiments are shown in FIGS. 6A and 6B.

Figure 6A:
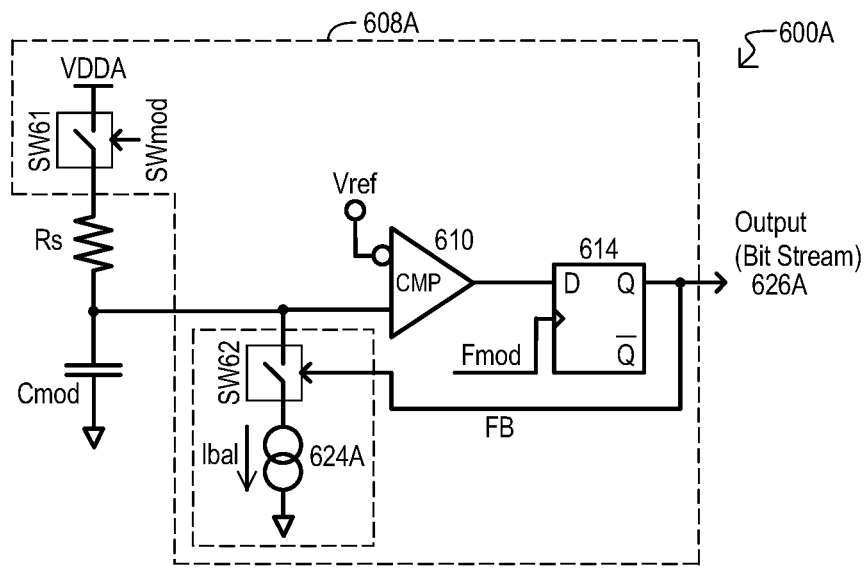
FIGS. 6A and 6B are schematic diagram of resistance sensing ADC systems having modulated balance current sources according to embodiments.
Figure 6B:
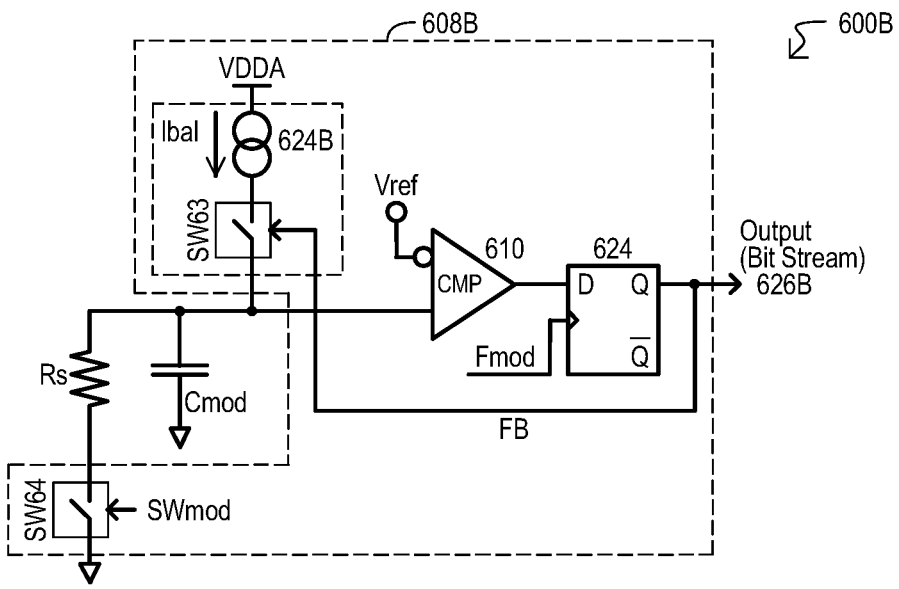

FIGS. 6A and 6B show resistance measurement systems 600A and 600B according to additional embodiments. FIGS. 6A and 6B include architectures like those of FIGS. 5A and 5B, respectively, but include a switch SW61/SW64 in series with a sensor resistance Rs. Switches SW61/SW64 can be controlled with a periodic signal SWmod having a duty cycle Dmod. In such an arrangement, operations may be optimal under the conditions:

$$\frac{VDDA - Vref}{Rs_{min}} \cdot Dmod < Ibal \quad \text{(FIG. 6A)}$$

$$\frac{Vref}{Rs_{min}} \cdot Dmod < Ibal \quad \text{(FIG. 6B)}$$

While embodiments like those of FIGS. 6A and 6B can accommodate greater maximum sensor current values, a resulting transfer function can have a digital value that is inversely proportional to sensor resistance.

Figure 7A:
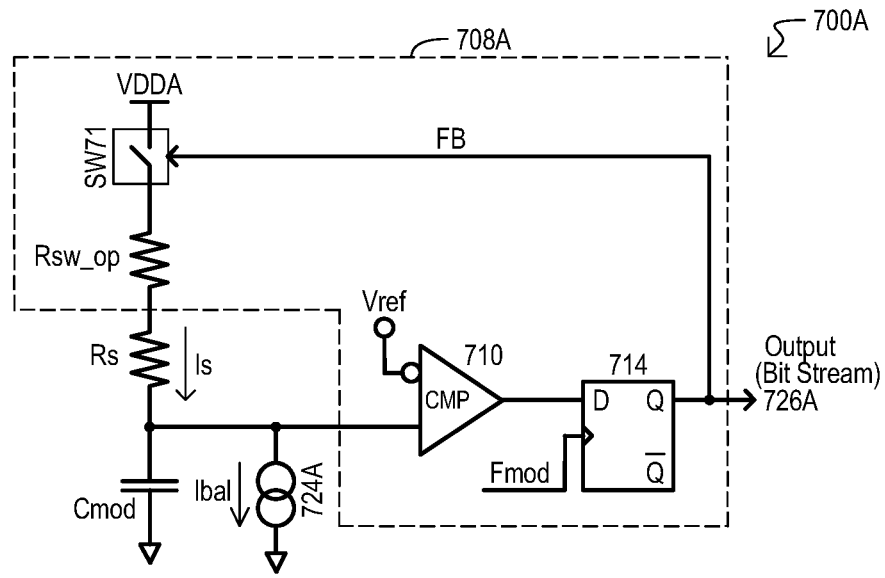
FIGS. 7A and 7B are schematic diagram of resistance sensing ADC systems having modulated sensor currents according to embodiments.
Figure 7B:
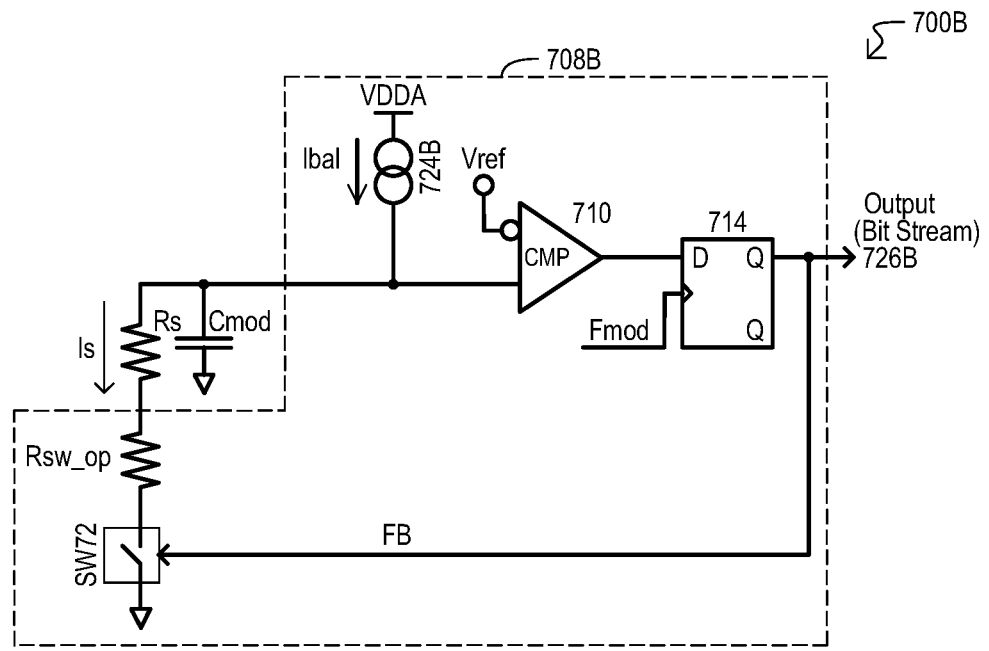

FIGS. 7A and 7B show resistance measurement systems 700A and 700B according to additional embodiments. The architecture of FIGS. 7A and 7B can include items like those of FIGS. 6A and 6B. However, FIGS. 7A and 7B do not include a switch in series with a current source 724A/724B. Rather, a switch (SW71/SW72) can be included that is in series with sensor resistance Rs to modulated a sensor current (Is) according to analog comparator output 726A. Further, FIGS. 7A and 7B include switch resistance values (Rs_op).

A transfer function for embodiments like those of FIGS. 7A and 7B can be given by:

$$D_x = \frac{Ibal}{VDDA - Vref} \cdot Rs \quad \text{(FIG. 7A)}$$

$$D_x = \frac{Ibal}{Vref} \cdot Rs \quad \text{(FIG. 7B)}$$

Further, the embodiments may operate optimally under the conditions:

$$\frac{VDDA - Vref}{Rs_{max}} > Ibal \quad \text{(FIG. 7A)}$$

$$\frac{Vref}{Rs} > Ibal \quad \text{(FIG. 7B)}$$

In some embodiments, a switch resistance (Rsw_op) can be included as part of Rs.

From the above transfer function it can be see that an output value Dx can be directly proportional to a sensor resistance Rs.

Figure 8:
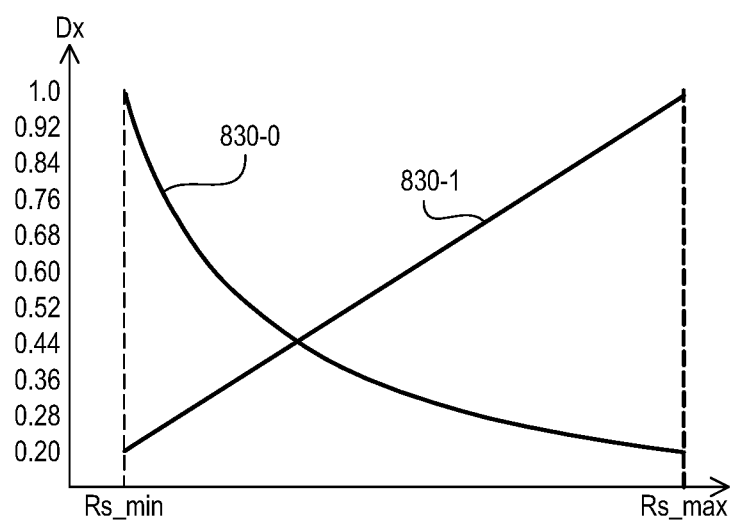
FIG. 8 is a graph comparing ADC conversion results between embodiments with and without current modulation.

FIG. 8 is a graph comparing responses of systems like those of FIGS. 6A/B and 7A/B. Response 830-0 shows a non-linear response for an embodiment like that of FIGS. 6A and 6B. Response 830-1 shows a linear response for an embodiment like that of FIGS. 7A and 7B.

Figure 9A:
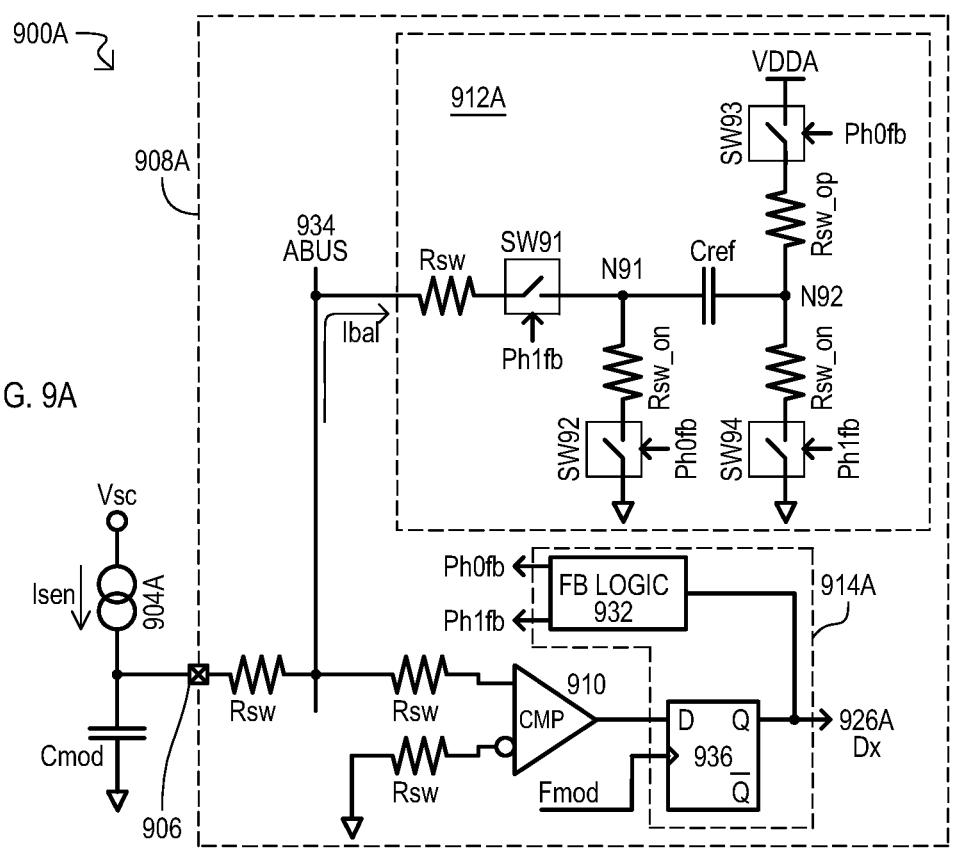
FIGS. 9A and 9B are schematic diagrams of sensor ADC systems with a sensor current source and a switched capacitor balance current generator according to embodiments.
Figure 9B:
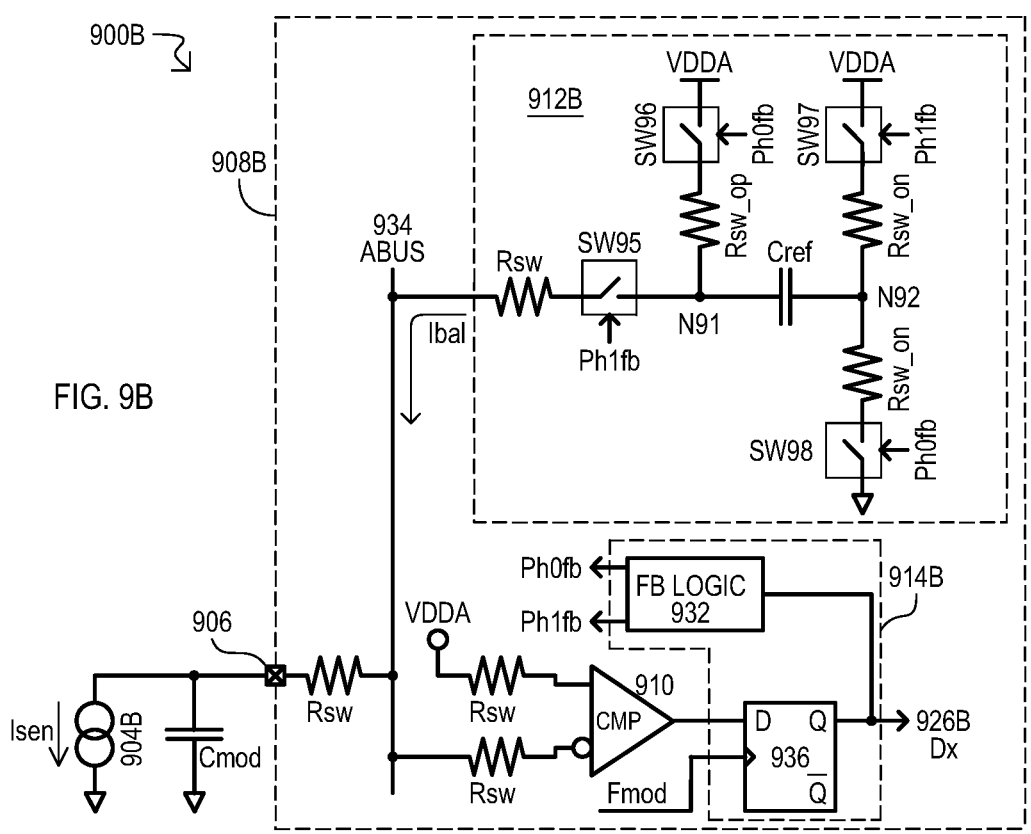

While embodiments like those shown in FIGS. 3 to 7B can include a reference voltage source and IDAC (e.g., for a balance current source), other embodiments can employ switched capacitor (SC) circuits for such circuit operations. FIGS. 9A and 9B are schematic diagrams showing such embodiments.

FIGS. 9A and 9B show current measuring systems 900A/900B that include SC balance current sources. FIGS. 9A and 9B show various resistance values Rsw. In some embodiments, such resistance values correspond to configurable analog switches enabled with configuration inputs to provide signal paths. Resistance values Rsw_on correspond to resistance values for corresponding switches in their conducting state.

FIG. 9A shows a system 900A for sensing a sensor current source according to an embodiment. A system 900A can include a sensor current source 904A, modulation capacitor Cmod, and C-ADC circuit 908A. A sensor current source 904A can represent a sensor current Isen provided by a sensor device. A sensor current Isen can vary according to sensor operation. A capacitance Cmod can be selected based on an expected sensor current range and/or balance current range.

A C-ADC circuit 908A can include an analog comparator 910, a SC balance current generator 912A, and a switch signal generator 914A. Analog comparator 910 can have a first input (+) connected to sensor current source 904A and Cmod and a second input (−) to a low power supply node (e.g., ground). SC balance current source 912A can include switches SW91 to SW94 and reference capacitance Cref. Switch SW91 can connect a first node N91 of Cref to the first input of analog comparator 910 and can be controlled by a signal Ph1*fb*. Switch SW92 can connect a first node N91 to a lower power supply node, and can be controlled by a signal Ph0*fb*. Switch SW93 can connect a high power supply node (VDDA) to a second terminal N92 of Cref and be controlled by signal Ph0*fb*. Switch SW93 can connect a low power supply node to the second terminal N91 and be controlled by a signal Ph1*fb*.

Switch signal generator 914A can include a DQ FF 936 and feedback (FB) logic 932. An output of analog comparator 910 can be connected to an input (D) of FF 936. An output (Q) of FF 936 can provide a bit stream output signal 926A, and can also be an input of FB logic 932. FF 936 can operate based on a modulation clock signal Fmod. FB logic 932 can generate switch control signals Ph0*fb* and Ph1*fb* that are active according to an output of analog comparator 910, and can have active levels that are non-overlapping in time.

In operation, a sensor current Isen can be sourced to charge Cmod. Once a voltage on Cmod rises above a voltage at the (−) input of analog comparator 910 (which can be about ground depending on resistance Rsw and any offset voltage), an output of comparator 910 can be driven high. This can activate switch control signals Ph0*fb*/Ph1*fb*. By switched capacitor action, node N92 can be charged toward VDDA then coupled to ground. Switch SW91 can be enabled, causing a sink balance current (Ibal) to flow that will serve to offset the sensor current Isen at the (+) input of analog comparator 910. When a voltage at the (+) input of analog comparator falls below that of the (−) input, signals Ph0*fb* and Ph1*fb* can be disabled, stopping a balance current Ibal. Isen can then begin charging Cmod once again.

It is noted that balance current generator 912A can be conceptualized as a switch capacitor resistor. As such, it can be configured to provide a balance current Ibal that depends on a modulating frequency Fmod and reference capacitance, and not upon a switch parasitic resistance (e.g., Rsw, Rsw_on).

In some embodiments, C-ADC circuit 908A can be part of an IC device that is separate from sensor current source 904A and Cmod. Sensor current source 904A and Cmod can be connected to such an IC device at an external connection 906. In some embodiments, C-ADC circuit 908A can include an analog bus 934, which can be a low resistance bus for analog signals that can be connected to circuit elements by configurable switches (represented by switch resistances Rsw). In some embodiments, a reference capacitance Cref can be a programmable capacitance of the IC device. However, in other embodiments, a reference capacitance Cref can be external to the IC device (i.e., connected via an external connection).

FIG. 9B shows a system 900B for sensing a sensor current source according to another embodiment. A system 900B can include items like those of FIG. 9A but can operate with a sensor current source 904B that sinks a current from Cmod.

In operation, a sensor current Isen can sink current from Cmod. Once a voltage on Cmod falls below a voltage an the (+) input of analog comparator 910 (which can be about VDDA depending on resistance Rsw and any offset voltage), an output of comparator 910 can be driven high, activating switch control signals Ph0*fb*/Ph1*fb*. By switched capacitor action, a balance current Ibal can be generated. As a result, a sourcing balance current (Ibal) can flow to the (−) input of analog comparator 910. When a voltage at the (−) input rises above that of the (+) input, signals Ph0*fb* and Ph1*fb* can be disabled, stopping a balance current Ibal. Isen can then begin discharging Cmod once again.

Embodiments of FIGS. 9A and 9B can have a transfer function given by:

$$Dx = \frac{1}{VDDA \cdot Cref \cdot fmod} \cdot Isen$$

Embodiments like those of FIGS. 9A and 9B may operate optimally when a maximum sensor current Isen is less than a balance current Ibal. Further, it is desirable for an analog comparator to have a "rail-to-rail" operation (i.e., be able to switch when inputs are near high or low power supply levels).

Figure 10A:
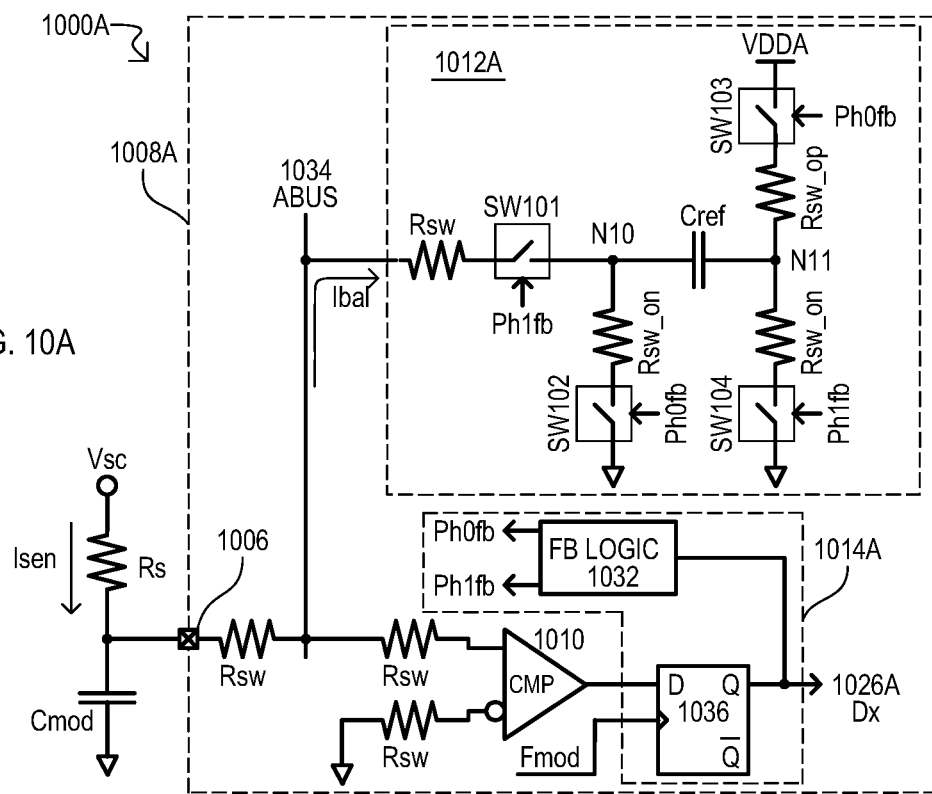
FIGS. 10A and 10B are schematic diagrams of sensor ADC systems with a sensor resistance and a switched capacitor balance current generator according to embodiments.
Figure 10B:
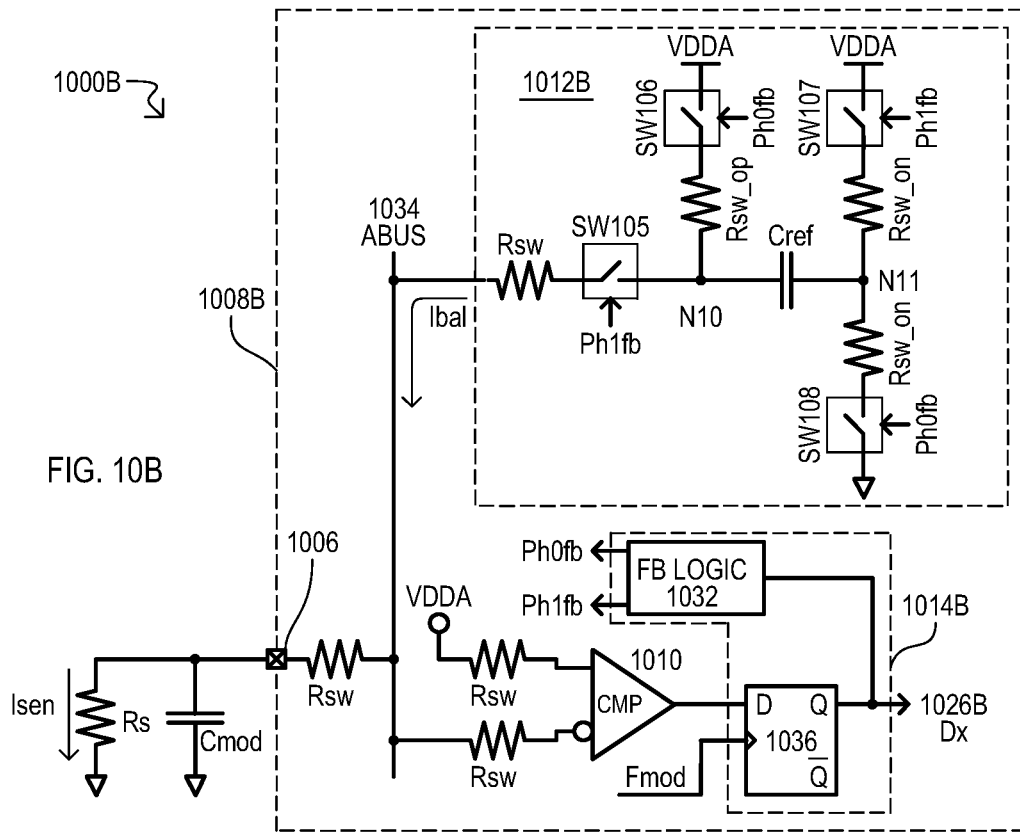

While FIGS. 9A and 9B show embodiments configured to convert a current from a sensor device, the same architecture can be advantageously applied to resistance sensing. FIGS. 10A and 10B are schematic diagram showing such embodiments.

FIGS. 10A and 10B show resistance measuring systems 1000A/1000B that include SC balance current sources. FIGS. 10A and 10B include the same architectures as FIGS. 9A and 9B, but with a sensor resistance Rs in place of a sensor current sources 904A/B. Accordingly, the operation of systems 1000A/B are understood with reference to FIGS. 9A/B.

The embodiments of FIGS. 10A and 10B can have a transfer function given by:

$$Dx = \frac{1}{Cref \cdot fmod} \cdot \frac{1}{Rs}$$

Advantageously, such a transfer function shows that conversion results are not influenced by VDDA. Accordingly, such embodiments can flexibly accommodate various power supply levels.

Embodiments of FIGS. 10A and 10B may operate optimally under the condition:

$$\frac{1}{Cref \cdot fmod} < Rs_{max}$$

where $Rs_{max}$ is a maximum expected resistance for Rs.

Figure 11:
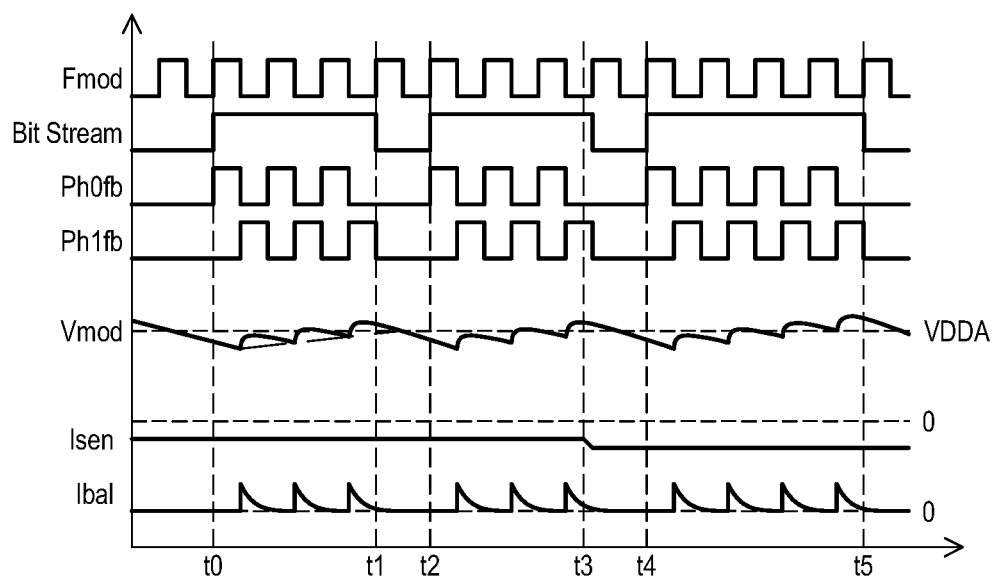
FIG. 11 is a timing diagram showing ADC current sense operations according to embodiments.

FIG. 11 is a timing diagram showing operations of a sensor current sinking embodiment, like that of FIG. 10B. FIG. 11 includes the following waveforms: a modulation clock (Fmod); an output bit stream (Bit Stream); switch control signals (Ph0fb, Ph1fb); a voltage on a modulation capacitance (Vmod); a sensor current Isen; and a generated balance current (Ibal).

Prior to time t0, a Isen can flow, discharging Cmod, resulting in Vmod dropping from VDDA.

At time t0, Vmod can drop below VDDA, causing an output of analog comparator to go high. As a result, feedback logic can generate non-overlapping switch control signals Ph0fb/Ph1fb, which can be synchronous with Fmod. By operation of switched capacitor action, balanced current generator can generate Ibal which acts against Isen at Cmod. Consequently, Vmod can begin to rise as Ibal counteract Isen.

At time t1, Vmod can rise above VDDA, causing an output of analog comparator to go low. As a result, switch control signals Ph0fb/Ph1fb can be disabled, ending the generation of Ibal. Isen can continue to flow, so Vmod can begin falling once again.

Times t2 to t3 can operate in the same fashion as times t0 to t1, and can represent a conversion result of Isen with Bit Stream being high for three Fmod cycles.

At time t3, a sensor resistance can decrease. As a result, Isen can increase (in the negative direction).

At time t4, Vmod can drop below VDDA, activating switched capacitor Ibal generator. However, because Isen had increased, it takes Ibal four clock cycles to drive Vmod back up to VDDA.

Times t4 to t5 can represent conversion result of the higher Isen level, with Bit Stream being high for four Fmod cycles.

While embodiments like those of FIGS. 10A and 10B can provide resistance sensing with corresponding advantages, it may be desirable to provide a conversion with a more linear relationship with respect to a sensor resistance. Such embodiments are shown in FIGS. 12A and 12B.

Figure 12A:
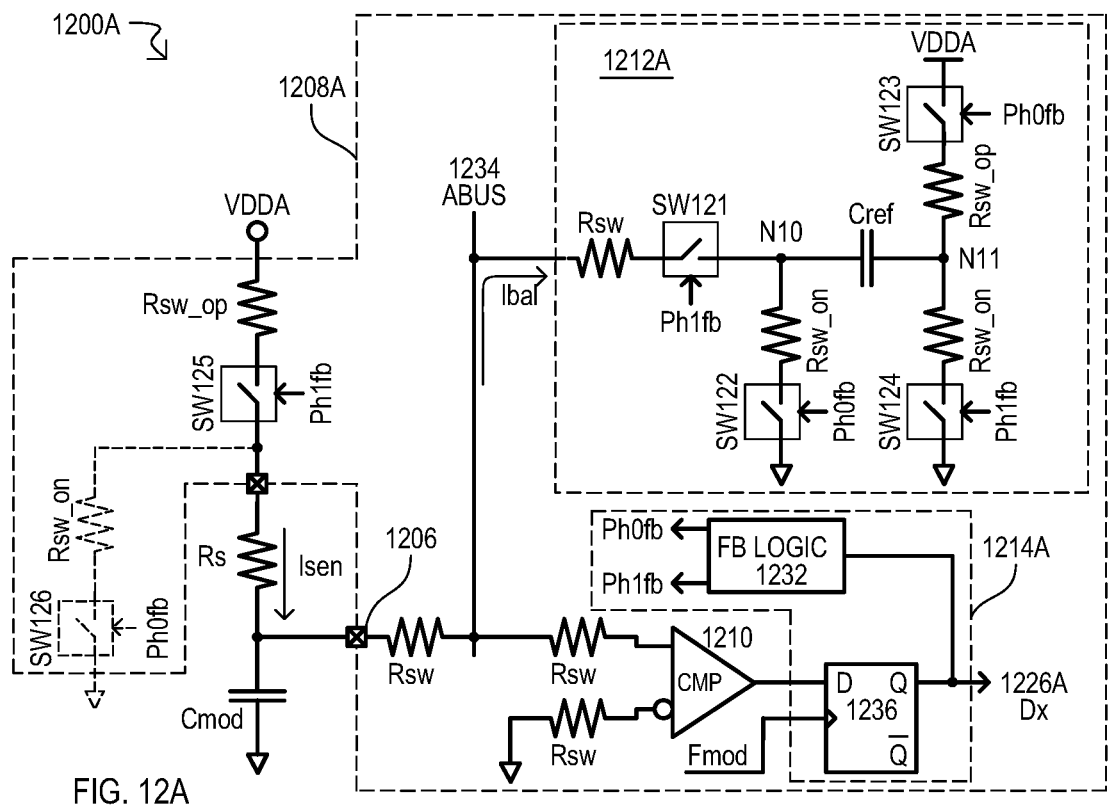
FIGS. 12A and 12B are schematic diagrams of sensor ADC systems with a modulated sensor current source and switched capacitor balance current generator according to embodiments.
Figure 12B:
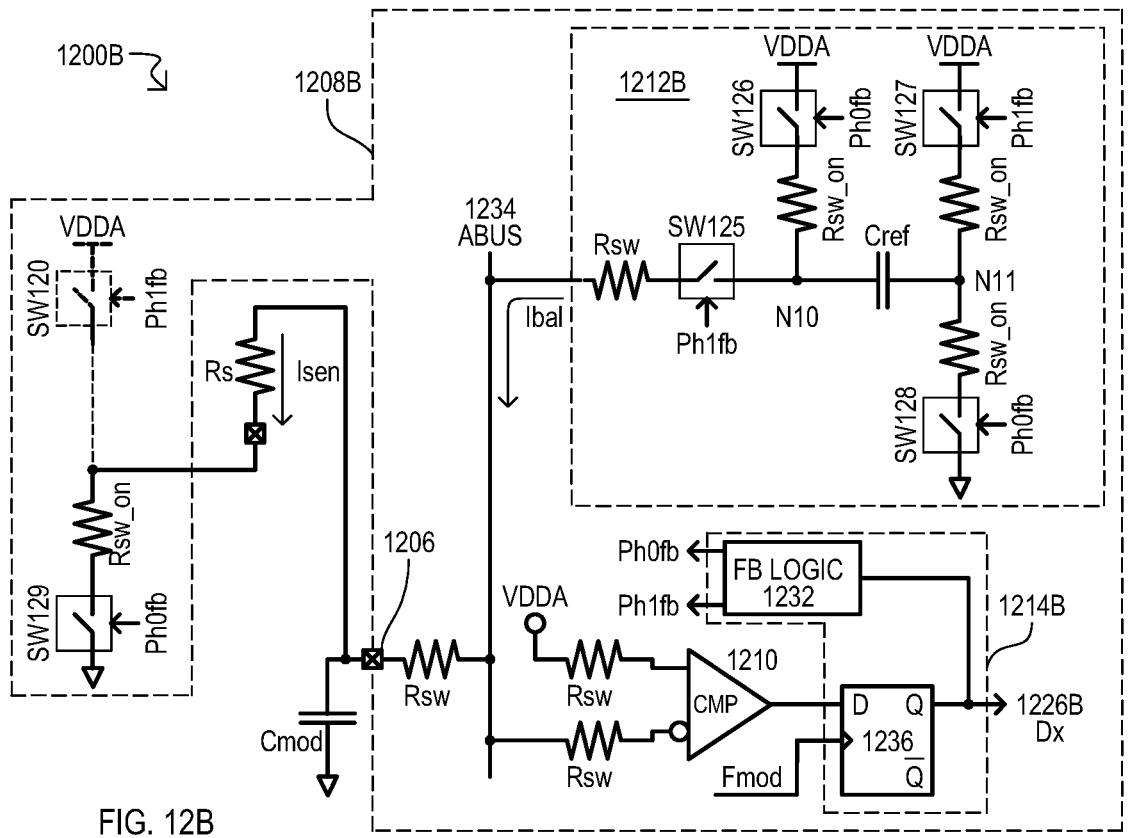

FIGS. 12A and 12B show resistance measuring systems 1200A/1200B that include SC balance current sources. FIGS. 12A and 12B include the same architectures as FIGS. 10A and 10B, but with the addition of a switch (SW125, SW129) in series with the sensor resistance Rs. Such a switch (SW125, SW129) can be modulated with a switch control signal Ph1fb. Optionally, systems 1200A/B can further include a second additional switch (SW126, SW120) that can bypass a power supply for the sensor resistance Rs.

Systems 1200A and 1200B can operate as described for systems 900A and 900B, respectively, but with the addition of switches SW125/SW129. In system 1200A, while a Cmod potential remains below the (−) input of analog comparator 1210, Isen can flow. Once a Cmod potential rise above the (−) input potential, Ibal can be generated as described for FIG. 9A. However, in addition, on Ph1fb phases, by operation of SW125 Rs can be isolated from VDDA, and Isen can stop flowing. Optionally, on Ph0fb phases, by operation of SW126, the Rs terminal opposite to that connected to Cmod can be connected to a low power supply (e.g., ground). Consequently, a sensor output potential can remain at about the same operating voltage during a sensing operation.

In system 1200B, while a Cmod potential remains above the (+) input of analog comparator 1210, Isen can flow, discharging Cmod. Once a Cmod potential falls below a (+) input potential, Ibal can be generated. In addition, on Ph0fb phases, by operation of SW129 Rs can be isolated from a low power supply potential, and Isen can stop flowing. Optionally, on Ph1fb phases, by operation of SW120, the Rs terminal opposite to that connected to Cmod can be connected to a VDDA.

The embodiments of FIGS. 12A and 12B can have a transfer function given by:

$$Dx = Cref \cdot fmod \cdot Rs$$

Embodiments of FIGS. 12A and 12B may operate optimally under the condition:

$$\frac{1}{Cref \cdot fmod} > Rs_{max}$$

Advantageously, the transfer function for FIGS. 12A/B shows a linear dependence upon Rs. As in the case of the embodiments of FIGS. 10A and 10B, conversion results are not sensitive to variations in a power supply voltage (VDDA). A sensitivity and resolution can be varied over a wide range by adjusting Ibal through Fmod and/or FB logic.

Figure 13:
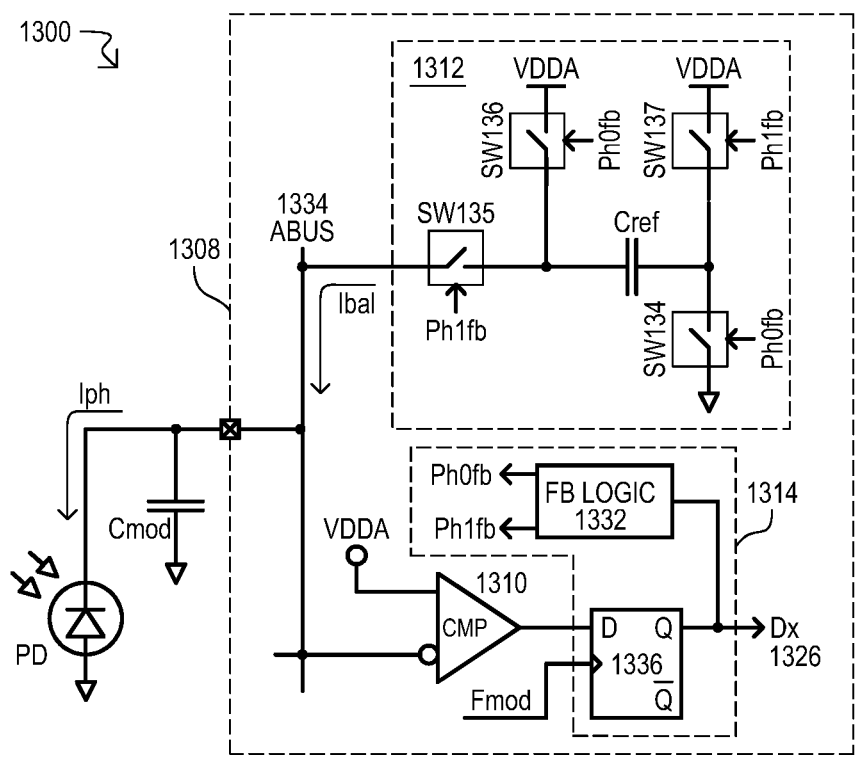
FIG. 13 is a schematic diagram of a photosensing ADC system according to an embodiment.

While embodiments can include any suitable current sensing application, some embodiment can include photosensing systems. According to embodiments, a current generating photosensing device, such as a photodiode, can have a current measured with a C-ADC circuit as described herein. Such a system can enjoy a wide variety of applications, including but not limited to: optical proximity detection, motion detection, light intensity detection, and a smoke alarm. FIG. 13 shows such an embodiment.

FIG. 13 is a schematic diagram of a photosensing system 1300 according to an embodiment. FIG. 13 includes the same general architecture as FIG. 9B, but with a photodiode PD in place of a sensor current sources 904B.

Figure 14:
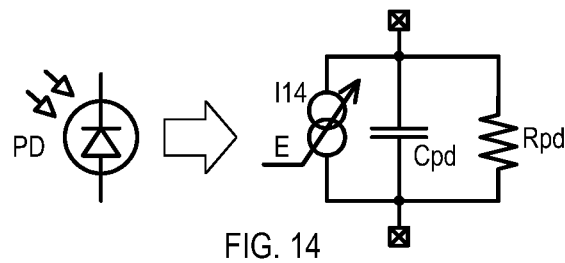
FIG. 14 is a schematic diagram of a photodiode equivalent circuit.

FIG. 14 shows a photodiode equivalent circuit. In response to incident light, a photodiode can generate a photocurrent Iph. Accordingly, the operation of system 1300 is understood with reference to FIG. 9B, where a photo diode operates as a light dependent current source, such as that shown in FIG. 14.

The embodiment of FIG. 13 can have a transfer function given by:

$$Dx = \frac{1}{VDDA \cdot Cref \cdot fmod} \cdot Iph$$

The embodiments of FIG. 13 may operate optimally under the condition:

VDDA·Cref·fmod>$Iph_{max}$ where $Iph_{max}$ is an expected maximum current from PD.

Figure 15:
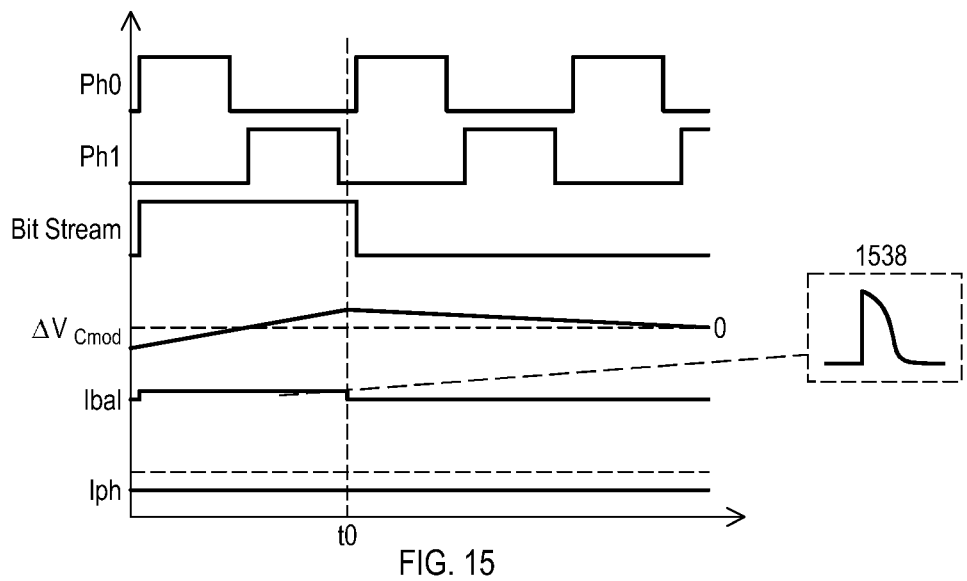
FIG. 15 is a timing diagram showing operations for an embodiment like that of FIG. 13.

FIG. 15 is a timing diagram showing an operation of an embodiment like that of FIG. 13. FIG. 15 includes the following waveforms: a phase signal Ph0 (Ph0*fb* can be a logical ANDing of Bit Stream and Ph0); a phase signal Ph1 (Ph1*fb* can be a logical ANDing of Bit Stream and Ph1); an output bit stream (Bit Stream); a change in a voltage on a modulation capacitance ($\Delta V_{Cmod}$); a generated balance Ibal; and a generated photodiode current (Iph).

Prior to time t0, Iph can have discharged Cmod, resulting in bit stream going high. As a result, Ibal can be active, which can take the form of pulses as shown by 1538.

At time t0, Ibal can charge Cmod above the voltage at the (+) input of the analog comparator, disabling Ibal. As a result, Iph can discharge Cmod.

Figure 16A:
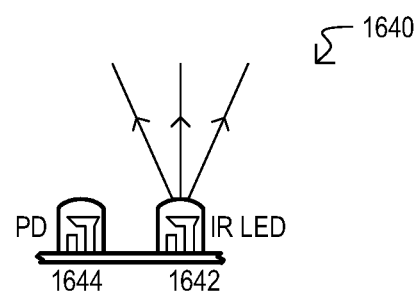
FIGS. 16A and 16B are diagrams showing a proximity sensor that can be included in embodiments.
Figure 16B:
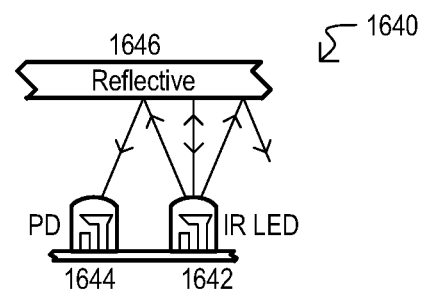

Embodiments can include various other photosensing applications, including proximity detection using a sensor that includes a light source and corresponding light detector. FIGS. 16A and 16B are diagrams showing a proximity sensor 1640 that can be included in embodiments. A proximity sensor 1640 can include a light source 1642, which can be a light emitting diode (LED), and a light detector 1644 which can be a PD. FIG. 16A shows sensor 1640 while an object is outside of a detection proximity. A light source 1642 can emit light that is not detected by light detector 1644. FIG. 16B shows sensor 1640 when an object is within a detection proximity. A light source 1642 can emit light that is reflected by a reflective surface 1646 of an object. The reflected light is sensed by PD 1644, which can generate a photocurrent.

While embodiments herein can include single-ended systems, in which a sensed current generates an input signal at one input of an analog comparator, embodiments can also include differential systems, in which sensor currents generate inputs at both inputs of an analog comparator.

Figure 17A:
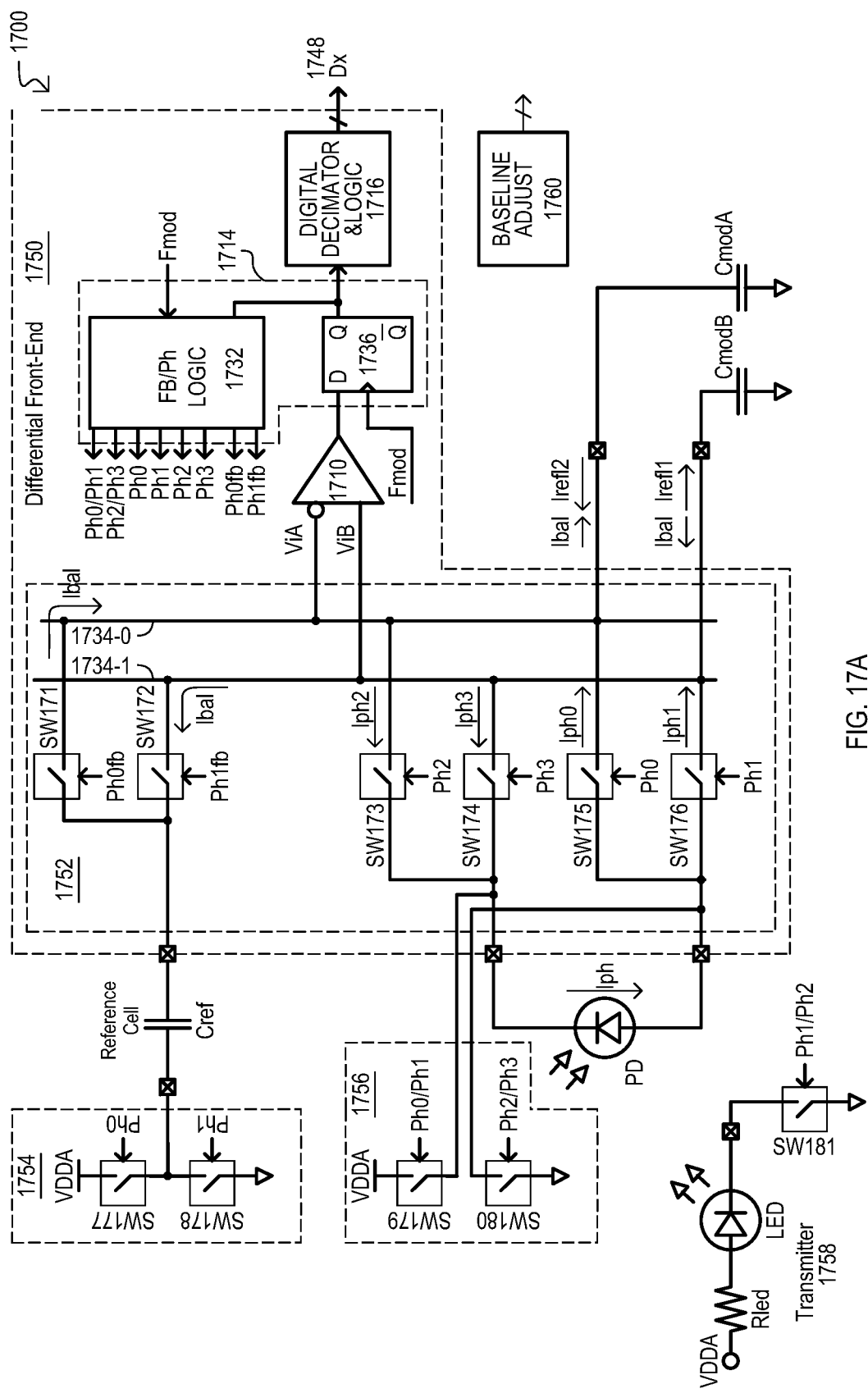
FIG. 17A is a schematic diagram of a proximity detection ADC system according to an embodiment.

FIG. 17A is a schematic diagram of a proximity sensing system 1700A according to an embodiment. A system 1700A can include a transmitter 1758, a detector PD, a differential front-end 1750, a reference switching section 1754, a detector switching section 1756, and baseline adjust circuits 1760.

A transmitter 1756 can include an LED, resistance Rled, and a switch SW181 connected in series. LED can emit light in one or more frequency ranges that are detectable by PD. SW181 can enable a current path through LED (and thus the emission of light) in response to a switch control signal Ph1/Ph2. PD can be a photodiode in a reverse bias configuration that can generate a current Iph in response to incident light from the LED.

A differential front-end 1750 can include an analog comparator 1710, switch signal generator 1714, digital processing circuits 1716, and a bridge switch section 1752. Analog comparator 1710 can have one input (+) connected to a first modulation capacitance CmodB, and the other input (−) connected to a second modulation capacitance CmodA. Switch signal generator 1714 can include a DQ FF 1736 clocked by Fmod arranged as in other embodiments, to generate a bit stream in response to an output from analog comparator 1710. An output of FF 1736 can be provided as an input to FB and phase (FB/Ph) logic 1732 and an input to digital processing circuits 1716. Phase and feedback logic 1732 can generate a number of switch control signals that will be described in more detail herein. Digital processing circuits 1716 can generate a multi-bit digital value from a bit stream output from FF 1736 according to any suitable manner. In some embodiments, digital processing circuits 1716 can include a digital decimator circuit, as well as digital filters.

A bridge switch section 1752 can include pairs of switches SW171/SW172, SW173/SW174, SW175/SW176 having first terminals commonly connected to one another, and second terminals connected to first and second analog buses 1734-0/1734-1, respectively. Switch pair SW171/SW172 can have a common node connected to a reference capacitance Cref. Switch pair SW173/SWW174 can have a common node connected to a first terminal of PD. Switch pair SW175/SWW176 can have a common node connected to a second terminal of PD. Analog bus 1734-0 can be connected to a modulation capacitance CmodB. Analog bus 1734-1 can be connected to a modulation capacitance CmodA.

A reference switching section 1754 can include a switches SW177 and SW178. SW177 can be connected between a high power supply VDDA and Cref, and can be controlled by signal Ph0. Switch SW178 can be connected between a low power supply (e.g., ground) and Cref, and can be controlled by signal Ph1.

A detector switching section 1756 can include a switches SW179 and SW180. SW179 can be connected between a high power supply VDDA and a first terminal of PD, and can be controlled by signal Ph0/Ph1. Switch SW180 can be connected between a low power supply and a second terminal of PD, and can be controlled by signal Ph2/Ph3.

Baseline adjust circuits 1760 can generate a baseline value B, which can be combined with a raw count value Dx to account for changing parameters, as will be described at a later point herein. In some embodiments, baseline adjust circuits 1760 can be a set of instructions executed by a processor in response to sensed conditions (e.g., temperature, VDDA level, background light).

Figure 17B:
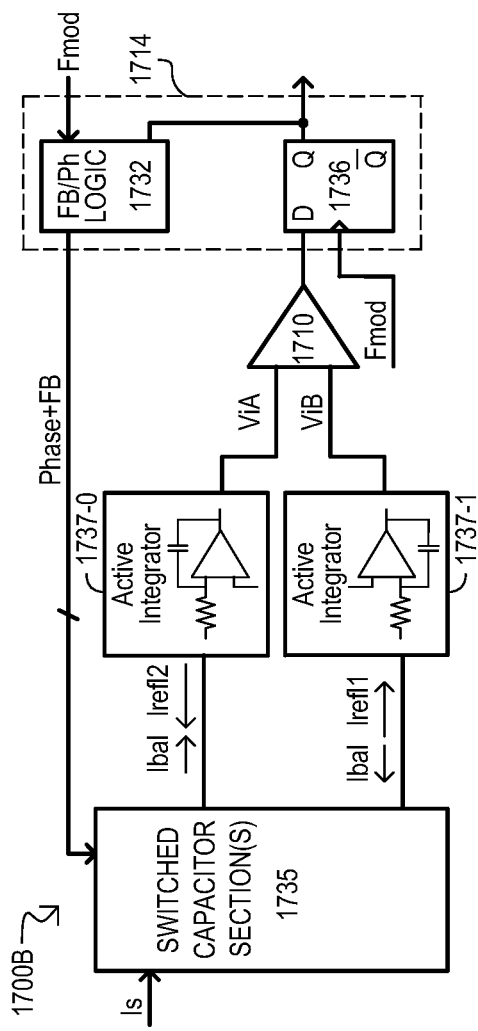
FIG. 17B is a block schematic diagram of an embodiment with active integrator circuits.

While embodiments can include passive integrator architectures, other embodiments can include active integrators. FIG. 17B is a block schematic diagram of a system 1700B having active integrators. A system 1700B can be a differential sensing system like that of FIG. 17A, including a switched capacitor section 1735 that can generate sense and balance currents (Is, Ibal) according to embodiments disclosed herein. Unlike FIG. 17A, system 1700B can include active integrators 1737-0/1 for integrating voltages at input nodes to comparator 1710. Active integrators 1737-0/1 can take any suitable form, according to expected application.

While FIG. 17B shows a differential architecture with active integrators, embodiments can also include single-ended architectures with active integrators.

Figure 17C:
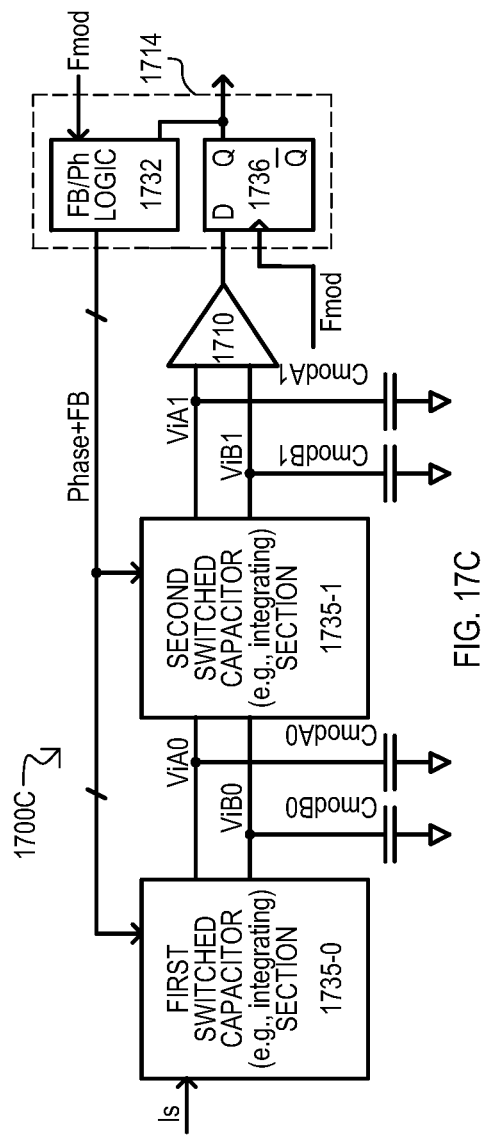
FIG. 17C is a block schematic diagram of an embodiment having a higher order of modulation.

While embodiments can include single integrator and difference stages, other embodiments can include higher order modulation architectures. FIG. 17C is a block schematic diagram of a system 1700C having a higher order of modulations. A system 1700C can be a differential sensing system like that of FIG. 17A. However, unlike FIG. 17A, a system 1700C can multiple switched capacitor stages 1735-0/1, each operating to integrate a modulation capacitance, and apply a difference value in response to a quantization stage (e.g., comparator 1710). While FIG. 17C shows second order modulation, other embodiments can include higher orders of modulation. As in the case of FIG. 17B, single-ended systems can also include higher orders of modulation.

Figure 18:
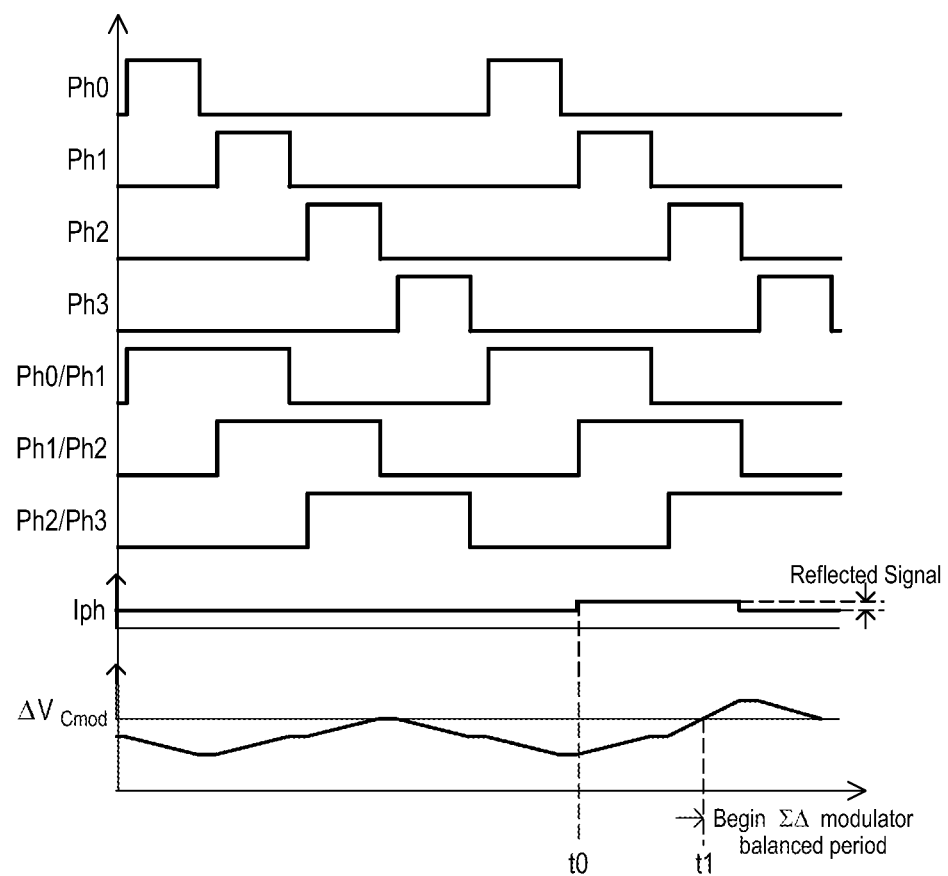
FIG. 18 is a timing diagram showing operations for an embodiment like that of FIG. 17A.
Figure 19A:
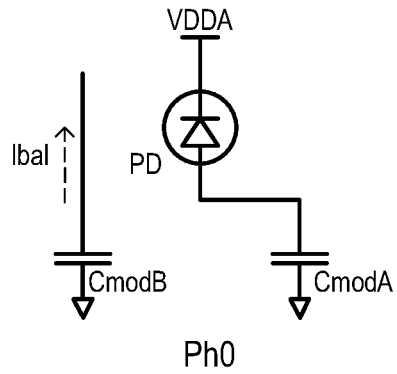
FIGS. 19A to 19D are schematic diagrams showing differential sensing operations for an embodiment like that of FIG. 17A.
Figure 19B:
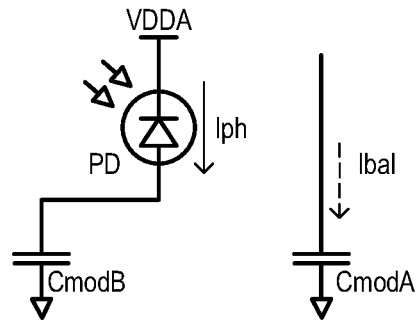
Figure 19C:
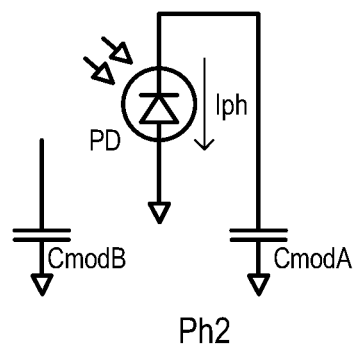
Figure 19D:
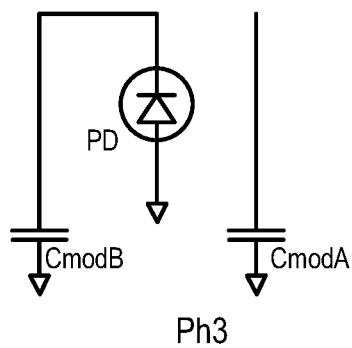

FIG. 18 is a timing diagram showing operations of a system 1700A. FIG. 18 includes the following waveforms: a switch control signals Ph0, Ph1, Ph2, Ph3, Ph0/1, Ph2/3; photocurrent Iph; and a differential voltage between a modulation capacitances CmodA/CmodB ($\Delta V_{Cmod}$). Switch control signals Ph0*fb* and Ph1*fb* (not shown in FIG. 18) are understood to be generated by a logical ANDing of the output of analog comparator 1710 and signals Ph0 and Ph1, respectively.

Referring back to FIG. 17A in conjunction with FIGS. 19A to 19D, a sensing operation according to an embodiment will be described. A sensing operations can occur in four phases, shown in FIGS. 19A to 19D. The four phases include Ph0, Ph1, Ph2 and Ph3 (examples of which are shown in FIG. 18). In a sense operation, a differential voltage can be generated across the inputs of analog comparator 1710. A voltage on CmodA (ViA) can be applied at a (−) input. A voltage on CmodB (ViB) can be applied at a (+) input. In some embodiments, a voltage on modulation capacitances CmodA and CmodB can be initialized to a same level (e.g., VDDA/2) prior to sensing operations.

In Ph0, by operation of switches SW179 and SW175, PD can be connected to VDDA in series with CmodA. At this time, transmitter 1758 is not enabled, so no photocurrent beyond that of any ambient light will contribute to the charging of CmodA. In the event a sufficient differential voltage exists at the input of analog comparator 1710 (ViB>ViA), by operation of SW172, an Ibal sink current can discharge CmodB (working against a voltage differential created by a photocurrent Iph).

In Ph1, by operation of switches SW176 and SW179, PD can be connected to VDDA in series with CmodB. In addition, within transmitter 1758, SW181 can enable LED. If light from the LED is detected (e.g., due to a reflecting object in proximity, and shown by arrows in the figure), PD can generate a photocurrent (Iph+Irefl1). Such a current can charge CmodB, increasing ViB. In the event a sufficient differential voltage exists at the input of analog comparator 1710 (ViB>ViA), by operation of SW171, an Ibal source current can charge CmodA (working against a voltage differential created by Iph).

In Ph2, by operation of switches SW180 and SW173, a PD can have an anode connected to a low power supply and a cathode connected to CmodA. At this time, LED can be enabled by SW181. If light from the LED is detected (shown by arrows in the figure), PD can generate a photocurrent (Iph+Irefl2) that sinks current from CmodA, decreasing ViA.

In Ph3, by operation of switch SW175, a PD can have cathode connected to CmodB. An anode of PD can be connected by ground by operation of switch SW180. At this time, the LED is disabled by operation of switch SW181.

In this way, if little or no additional photocurrent (Iph) is generated due to LED, CmodA and CmodB can be charged to the same essential potential in phases Ph0 and Ph1. However, if a sufficient Iph is generated in Ph1, a differential voltage will be generated, with ViB>ViA. Similarly, in phases Ph2 and Ph3, if little or no additional Iph is generated, CmodA and CmodB can be discharged to the same essential potential. However, if a sufficient Iph is generated in Ph2, a differential voltage will be generated, with ViB>ViA.

Once a differential voltage (ViB−ViA) is sufficient for analog comparator 1710 to drive its output to an opposite level (i.e., a feedback active level), a balance current Ibal can be generated. If feedback is active during Ph0, a balance current Ibal can sink current from CmodB. If feedback is active during Ph1, a balance current Ibal can source current to CmodA. The balance currents thus work to reduce any differential voltage created by Iph.

Referring once again to FIG. 18, prior to time t0, photocurrent Iph is at a non-detection level (e.g., background light). As a result, a differential voltage $\Delta V_{Cmod}$ operates in balanced state, CmodA and CmodB charging and discharging essentially the same amount of current.

At time t0, Iph increases, indicating the detection of reflected light. As a result, the differential voltage triggers the analog comparator, which drives its output to an active level.

At time t1, a balance current circuit is enabled to generate a balance current that tends to reduce $\Delta V_{Cmod}$. Such an operation can be conceptualized as a $\Sigma\Delta$ modulation period, as generation of the balance current can operate like a feedback signal of a $\Sigma\Delta$ modulator circuit.

In this way, differential sigma-delta modulator operation can detect a voltage difference and compensates for this difference using a balancing current. It is noted in differential architectures according to embodiments, ambient light can be a common mode value. As shown in FIG. 18, in the first two phases (i.e., Ph0/Ph1), a voltage on CmodA and CmodB can increase by the same amount. In the second two phases (i.e., Ph2/Ph3), a voltage on CmodA and CmodB can decrease by the same amount. Thus, an overall $\Delta V_{Cmod}$ from the ambient light is zero. A balance current can be generated by a switched capacitor circuit that includes a reference capacitor Cref and four analog switches (SW171, SW172, SW177, SW178). By operation of FB/Ph logic 1732, the switched capacitor circuit can be clocked by an Fmod clock signal that can have a much higher frequency than the sensor stimulation signal frequency (i.e., Ph1/Ph2). A variation of the duty cycle of the sigma-delta modulator output signal (i.e., output of analog comparator 1710) indicates variations in LED reflected light.

The embodiment of FIG. 17A can have a transfer function given by:

$$DC = \frac{Irefl}{Cref \cdot VDDA \cdot F\mathrm{mod}} + B$$

$$RawData = DC \cdot (2^n - 1)$$

where DC is an average duty cycle of an output signal (i.e., output of FF 1736); n is a resolution of the digital processing circuit 1716; Irefl is the PD photocurrent contributed by reflected light; Fmod is the modulator frequency; and B is baseline value. RawData can be a value Dx. Baseline value B can vary according to an offset voltage of analog comparator 1710, mismatch between modulator capacitances (CmodA, CmodB), the value of Cref, VDDA, Fmod and temperature. It is noted that baseline value B can depend on slowly changing parameters and conditions.

Embodiments like those of FIG. 17A can reduce DC and low frequency currents in a detector PD. Further, embodiments can generate a modulated transmission signal (e.g., LED with Ph1/Ph2) that can be synchronously demodulated at the detector (Ph1/Ph2).

Figure 20:
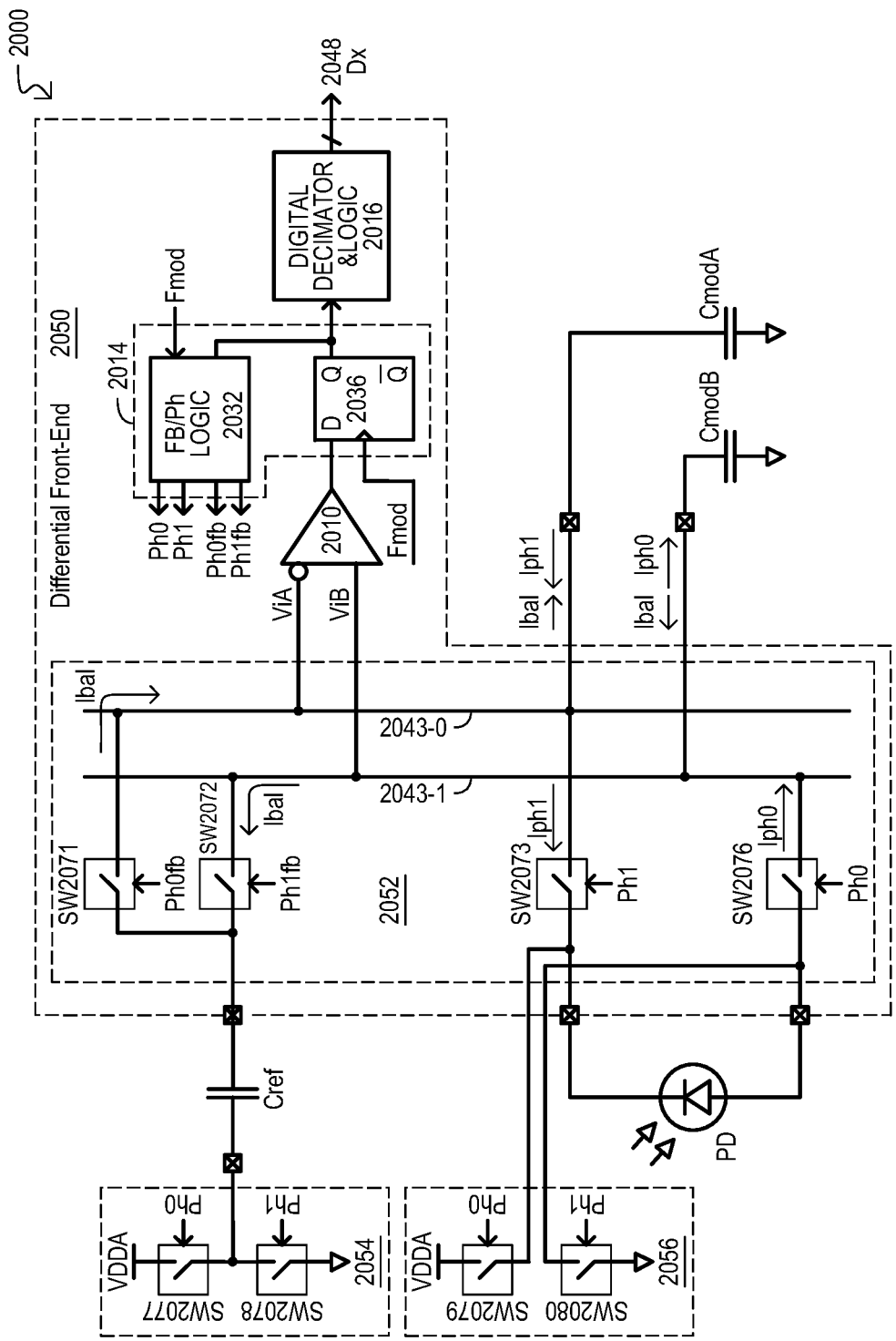
FIG. 20 is a schematic diagram of a light intensity sensing ADC system according to an embodiment.

A differential sensing architecture like that of FIG. 17A can be employed for any suitable sensor type as described herein. FIG. 20 shows a light intensity sensing system 2000 with a differential front end according to an embodiment.

A system 2000 can include items like those of FIG. 17A, and their operation is understood from the description of FIG. 17A. Differences between FIG. 20 and FIG. 17A include a sensing operation that is a two-phase operation instead of a four phase operation. Accordingly, FB/Ph logic 2032 does not generate Ph2, Ph3 and related signals.

Figure 21A:
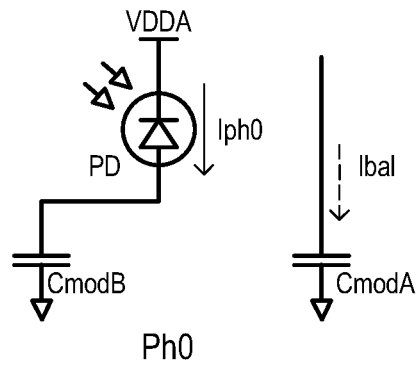
FIGS. 21A and 21B are schematic diagrams showing differential sensing operations for an embodiment like that of FIG. 20.
Figure 21B:
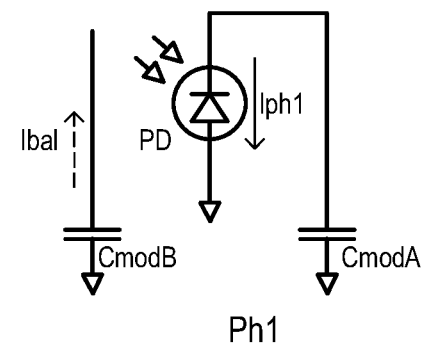

FIGS. 21A and 21B show sense operations for an embodiment like that of FIG. 20. FIG. 21A shows a first phase Ph0. FIG. 21B shows a second phase Ph1. As in the case of FIG. 17A, prior to sensing operations, capacitances CmodA and CmodB can be initialized to a same value (e.g., VDDA/2).

In Ph0, by operation of switches SW2076 and SW2079, an anode of PD can be connected to CmodB and a cathode of PD connected to VDDA. According to the amount of light detected, PD can generate a photocurrent (Iph0). Such a current can charge CmodB, increasing ViB. In the event a sufficient differential voltage exists at the input of analog comparator 2010, by operation of SW2072, a balance current Ibal can be generated that sources current to CmodA (working against a voltage differential created by PD photocurrents).

In Ph1, by operation of switches SW2080 and SW2073, a PD can have an anode connected to a low power supply and a cathode connected to CmodA. According to detected light, PD can generate a photocurrent (Iph1) that sinks current from CmodA, decreasing ViA. In the event a sufficient differential voltage exists at the input of analog comparator 2010, by operation of SW2071, a balance voltage Ibal can sink current from CmodB (working against a voltage differential created by a photocurrent).

It is understood from the descriptions of FIGS. 17 to 21B, that embodiments can include differential front ends for use with any other suitable sensor device.

Figure 22:
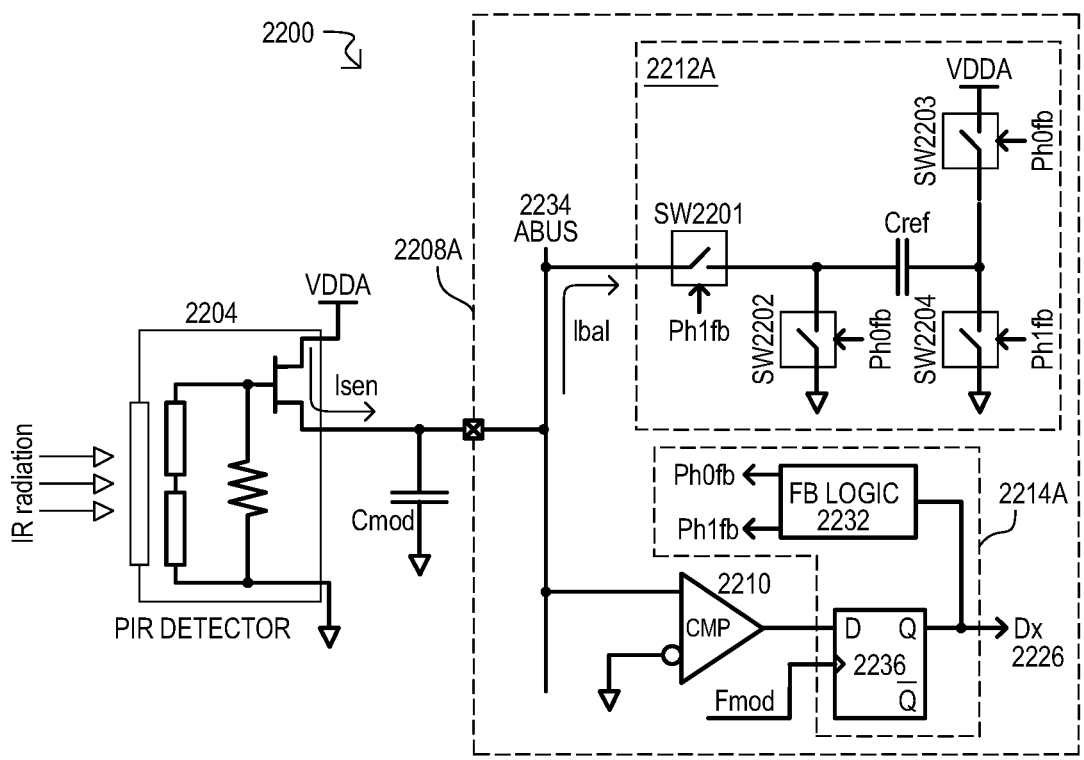
FIG. 22 is a schematic diagram of a passive infrared (PIR) proximity detection ADC system according to an embodiment.

FIG. 22 is a block schematic diagram of PIR detector system 2200 according to an embodiment. A PIR detector system 2200 can use a PIR sensor 2204 for motion sensing or the like. A PIR sensor 2204 can be configured to detect infrared radiation typically emitted by the human body (e.g., 6-14 μm wavelengths).

A system 2200 can include items like those of FIG. 10A, and their operation is understood from the description of FIG. 10A. FIG. 22 differs from FIG. 10A in that a C-ADC circuit 2208 can receive a sensor current from a PIR sensor 2204 instead of a sensor resistance Rs. In response to sensing the target IR radiation, PIR sensor 2204 can generate a current Isen. When Isen charges Cmod high enough to cause analog comparator 2210 output to go high, enabling the generation of a balance current Ibal by switched capacitor action.

Figure 23:
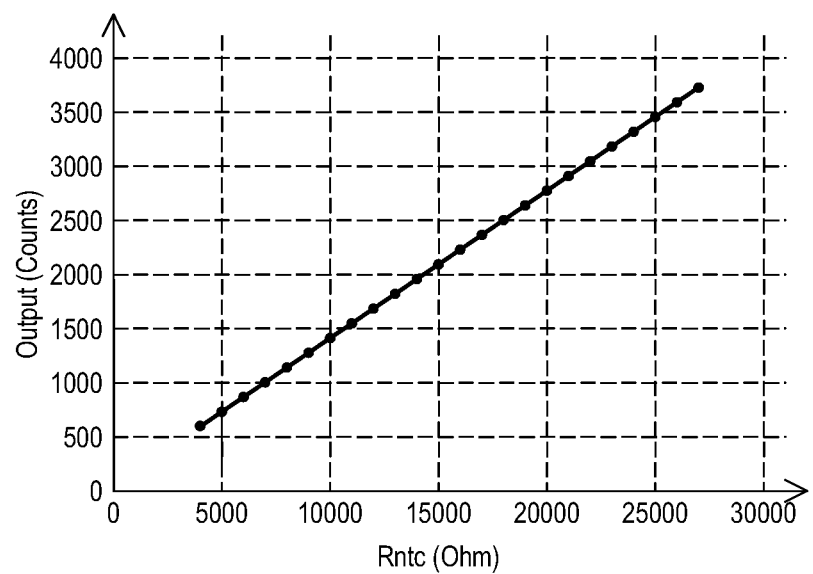
FIG. 23 is a graph showing ADC conversion results according to an embodiment.

FIG. 23 is a graph showing sensing results for an embodiment like that of FIGS. 10A and 10B. The graph shows output count values versus a sensor resistance (Rntc) value. As shown, a count value can have an essentially linear relationship to a sensed resistance.

Figure 24:
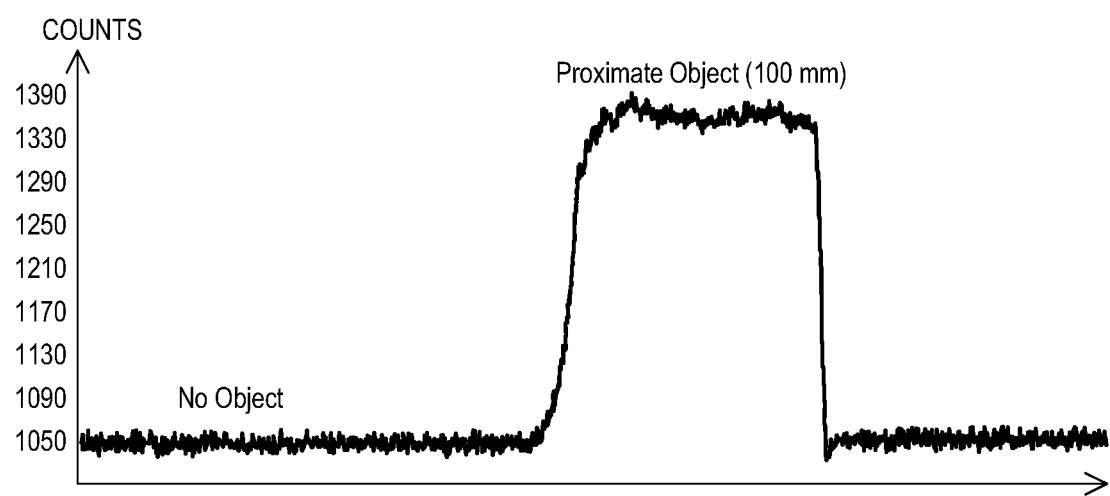
FIG. 24 is a graph showing results of a system like that of FIG. 22.

FIG. 24 is a graph showing proximity sensing results for an embodiment like that of FIG. 17A. When an object is not in proximity, a count value can be lower (i.e., about 1050). When an object is in proximity, in this example 100 mm, a reflected light can increase a count value to about 1360, detecting the object.

Figure 25:
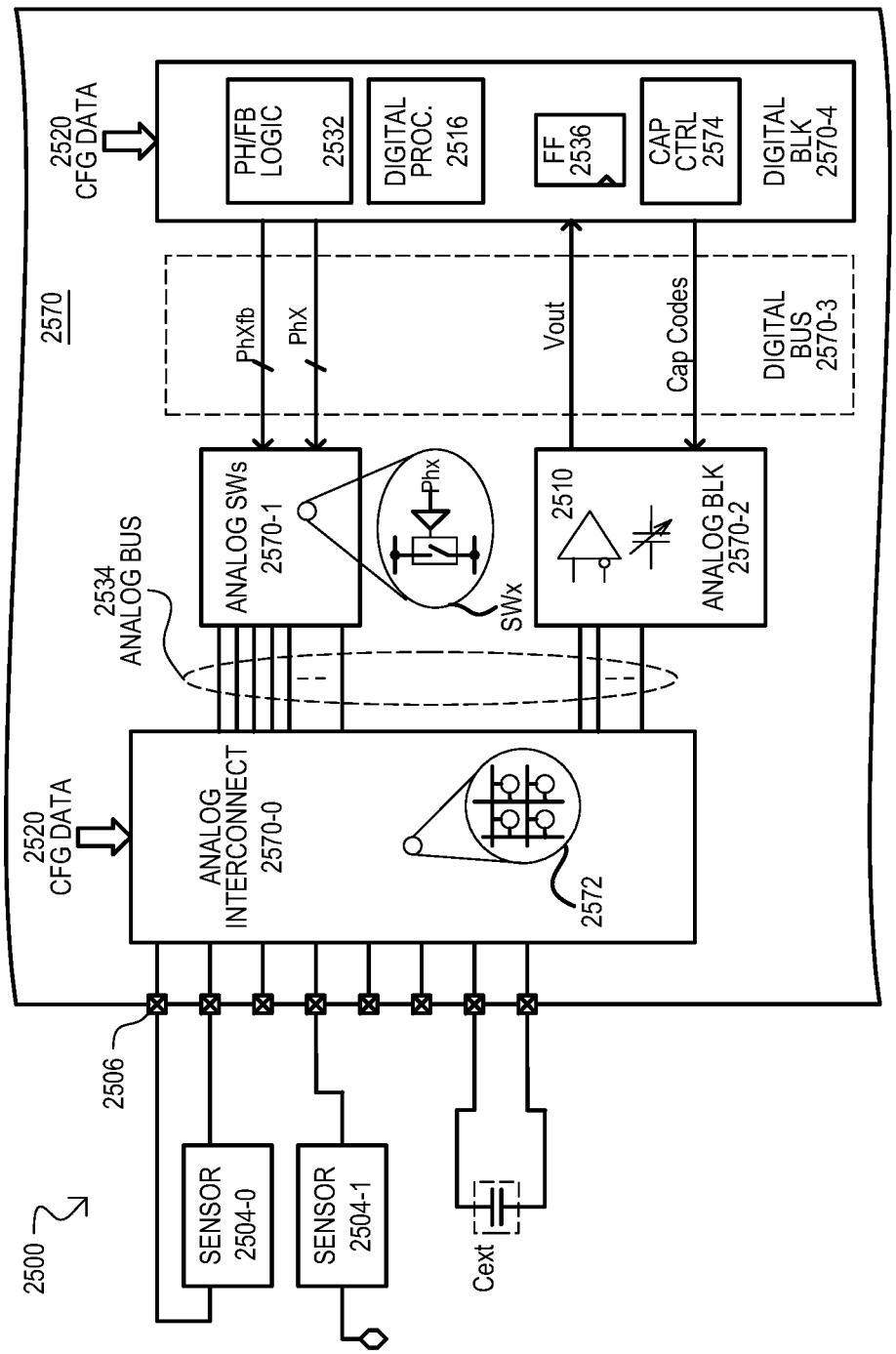
FIG. 25 is a block diagram of a multi-sense system according to an embodiment.

Embodiments can take any suitable circuit form, however, some embodiments can include an IC device, such as a system-on-chip (SoC) that is configurable to accommodate various different sensor types and sensor architectures. In some embodiments an IC device can be a mixed signal SoC having configurable analog and digital circuits. FIG. 25 is a block diagram of such an embodiment.

FIG. 25 is a block diagram of a system 2500 according to an embodiment. A system 2500 can include an IC device 2570 that can connect to various sensors (two shown as 2504-0, 2504-1). IC device 2570 can be configurable in response to configuration data 2520.

IC device 2570 can include analog interconnect 2570-0, configurable analog switches 2570-1, and configurable analog circuit block 2570-2 in communication with one another over an analog bus system 2534. IC device 2532 can also include configurable digital blocks 2570-4 which can be connected to configurable programmable analog switches 2570-1 and configurable analog circuit block 2570-2 by a digital bus system 2570-3.

Analog interconnect 2570-0 can be coupled to external connections (one shown as 2506) and can include a matrix formed of programmable connections (a portion shown as 2572). Interconnections can be established within analog interconnect 2534 with analog configuration data 2520. Configurable analog switches 2570-1 can include analog switches (one shown as SWx) that can be controlled by signals provided by digital bus (PhXfb, PhX). Configurable analog circuit block 2570-2 can include various analog circuit blocks, including one or more analog comparators 2520 and one or more programmable capacitances, IDACs or VDACs. One or more outputs (Vout) from comparators can be provided to digital bus system 2570-3. Programmable capacitances can be programmed by Cap Codes via digital bus system 2570-3.

Configurable digital blocks 2570-4 can include digital circuits configurable into various arithmetic logic functions by configuration data 2520. Such various arithmetic logic functions can include phase and/or feedback logic 2532, FFs 2536, and digital processing circuits 2516 as described herein. Configurable digital blocks 2570-4 can also include a capacitor controller 2574, which can store and provide capacitance codes to programmable capacitances in configurable analog circuit block 2570-2. Such a feature can enable reference capacitances (Cref), as described herein, that are configurable into any of various capacitance values.

Configuration data 2520 can configure device 2570 into a sensing device by coupling the various circuit components together according to any of the embodiments disclosed herein, or equivalents.

Figure 26:
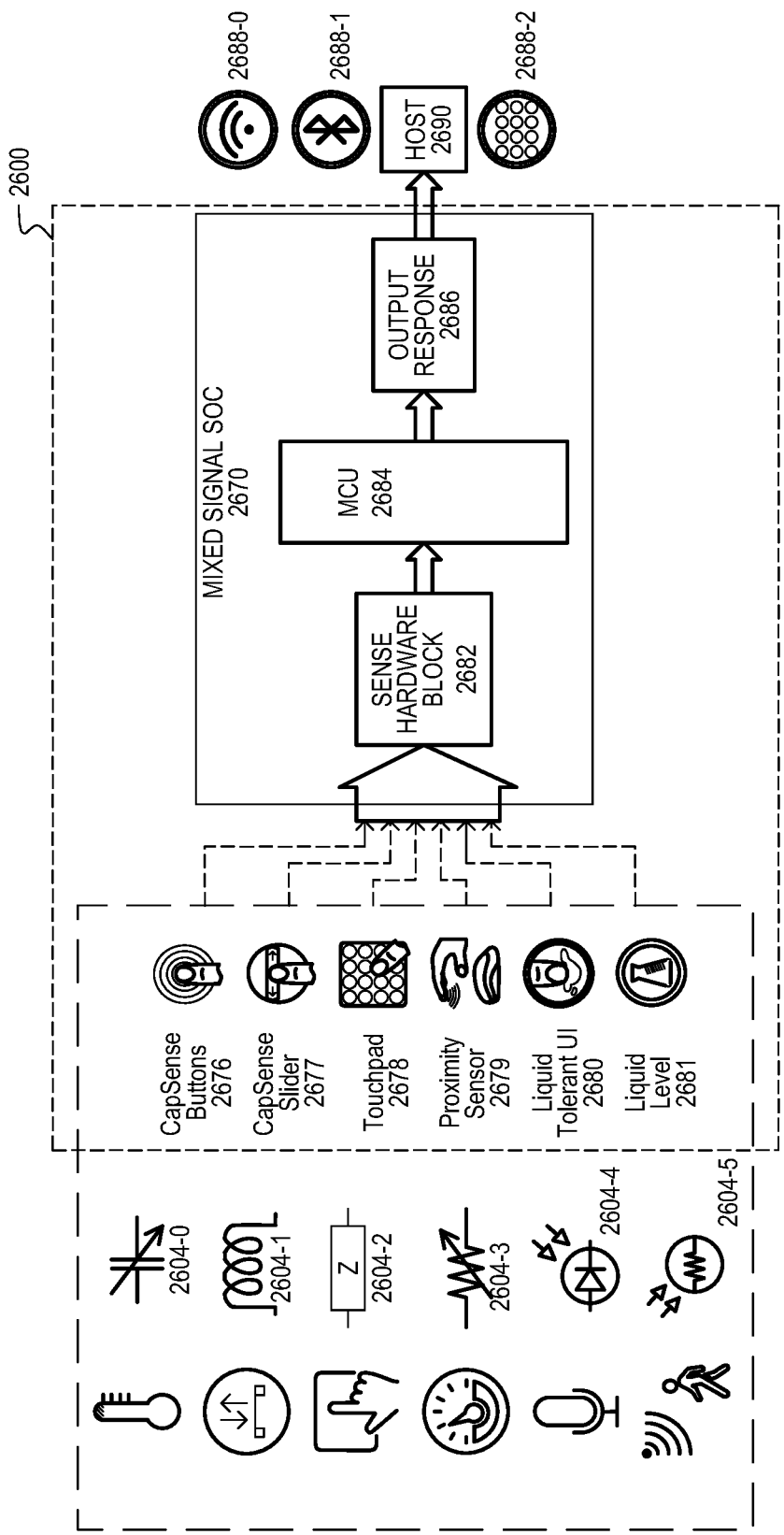
FIG. 26 is a block diagram showing various systems and applications according to embodiments.

Embodiments can provide solutions to sensor needs in a wide variety of applications. FIG. 26 is a block diagram of sensing systems 2600 according to various embodiments.

Sensing systems 2600 can include a mixed signal SoC 2670 having sense hardware blocks 2682, a microcontroller 2684, and can generate a digital sense output response 2686. Sense hardware blocks 2682 can include analog and digital circuits that form or can be configured into sensing circuits as described herein and equivalents. MCU 2684 can execute instructions for analyzing and/or processing sense values (e.g., raw code values) generated by hardware block 2682. Output response 2686 can be organized into a format suitable for an output destination.

Sensing systems 2600 can include any number of sensor input devices, including any of those described herein, as well as other including but not limited to: capacitance sense buttons 2676, capacitance sense sliders 2677, a touchpad 2678, a proximity sensor 2679, a liquid tolerant user interface 2680 or a liquid level detector 2681. Further, a system 2600 can accommodate any number of sensor mechanisms, including but not limited to: a variable capacitance 2604-0, a variable inductance 2604-1, a variable impedance 2604-2, a variable resistance 2604-3, a photocurrent generating device 2604-4 (e.g., PD or phototransistor), and/or a photoresistor 1604-5.

Sensing system 2600 can provide output results to any suitable destination location, including but not limited to: transmission according to a longer range wireless connection 2688-0, a short range wireless connection 2688-1, a user interface 2688-2 or directly to a host device 2690 via a wired connection.

While the various devices and systems have disclosed a number of sensing methods, additional methods will now be described with reference to flow diagrams.

Figure 27:
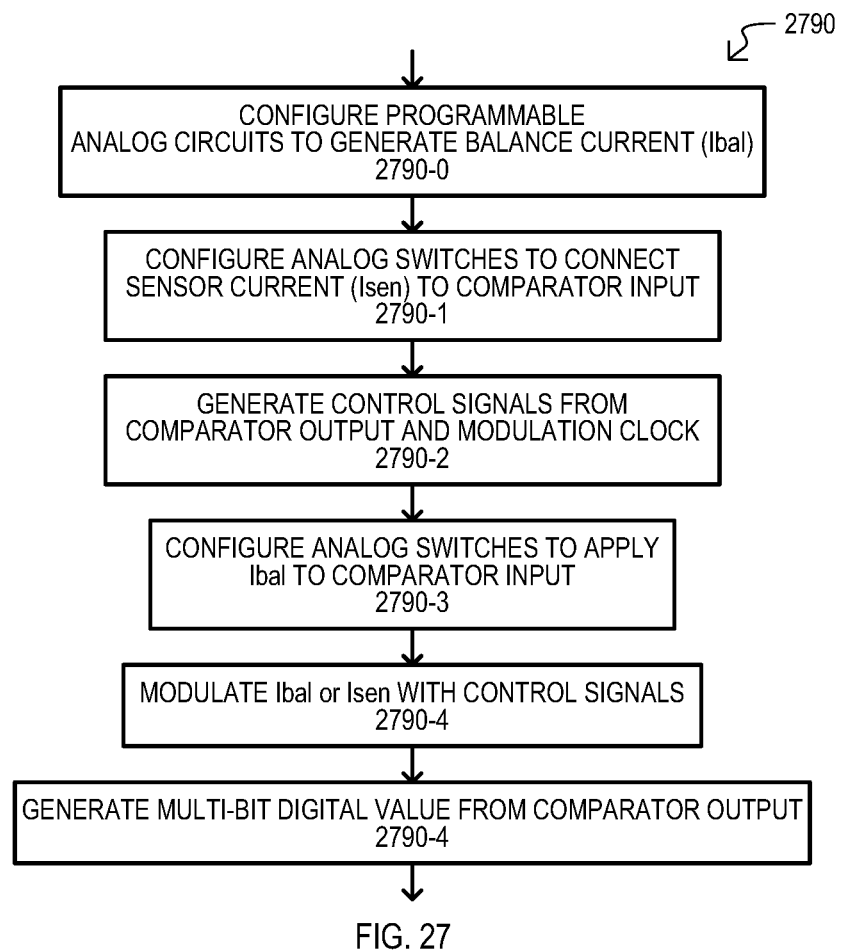
FIG. 27 is a flow diagram of a method according to an embodiment.

FIG. 27 is a flow diagram of a method 2790 according to an embodiment. A method 2790 can include configuring programmable analog circuits to generate a balance current (Ibal) 2790-0. Such an action can include configuring Ibal to have a magnitude and duration to balance an expected sensor current (Isen) at the input of a comparator 2790-0. Such an action can include any suitable steps, including but not limited to: providing configuration values for a programmable IDAC or configuring a switched capacitor circuit that generates Ibal. Analog switches can be configured to connect a sensor current to an input of a comparator 1790-1. Such an action can include controlling analog switches with switch control signals and/or configuration values to provide a conductive path from an external connection to a comparator circuit.

A method 2790 can further include generating control signals from an output of a comparator and a modulation clock 2790-2. In some embodiments, such an action can include using digital circuits to generate control signals synchronous with a modulation clock. Analog switches can be configured to apply Ibal to a comparator input 2790-3. Such an action can include using configuration inputs to form a desired signal path for Ibal and/or dynamically enable a current path with switch control signals. In some embodiments, Ibal can be applied to a same comparator input as Isen, and flow in an opposite direction than Isen with respect to the comparator input. In other embodiments, Ibal can be applied to a different comparator input than Isen.

A method 2790 can also include modulating Ibal or Isen with the control signals 2790-4. Such an action can include enabling and disabling Ibal or Isen according to the control signals. In some embodiments, such an action can essentially serve as a feedback mechanism, forcing a voltage at comparator inputs in a direction opposite to its current state.

A multi-bit digital value can be generated from a comparator output 2790-4. Such an action can include any suitable conversion method, including those employed on back ends of sigma-delta modulators. In some embodiments, such an action can include sampling a comparator bit stream output.

Figure 28:
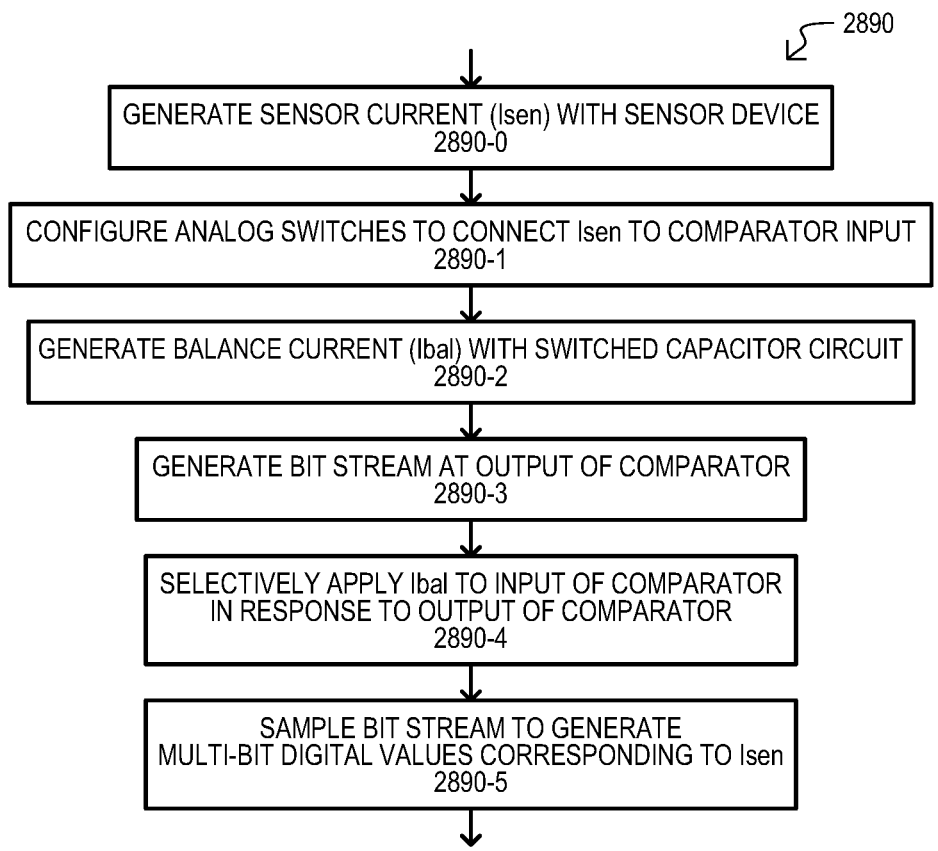
FIG. 28 is a flow diagram of a method according to another embodiment.

FIG. 28 is a flow diagram of a method 2890 according to another embodiment. A method 2890 can include generating Isen with a sensor device 2890-0. Such an action can include generating a sensor current according to any of the sensor mechanisms described herein, including but not limited to generating a current from: a photoelectric device, a variable capacitance, a variable resistance, a variable inductance, or a variable impedance. Analog switches can be configured to connect Isen to a comparator input 2890-1. Such an action can include configuring programmable switches to enable a static or dynamic path between a sensor and the comparator.

A method 2890 can include generating Ibal with a switched capacitor circuit 2890-1. Such an action can include any suitable switched capacitor circuit, including but not limited to charging a capacitor, then connecting a charged capacitor terminal to a low power supply to generate a negative Ibal source voltage and/or connecting a ground terminal of the capacitor to a high supply voltage to generate a higher than supply Ibal source voltage.

A method 2890 can also include generating a bit stream at the output of the comparator 2890-3. Such an action can include driving a comparator output between high and low states as Isen is received at inputs (and balanced with a Ibal). Ibal can be selectively applied to a comparator input in response to an output of the comparator 2890-4. Such an action can serve as a feedback mechanism, counteracting the effect of Isen at the comparator input.

A method 2890 can include sampling the bit stream to generate multi-bit digital values 2890-5. In some embodiments, such an action can include determining the amount of time a comparator output was high in a given sampling period.

Figure 29:
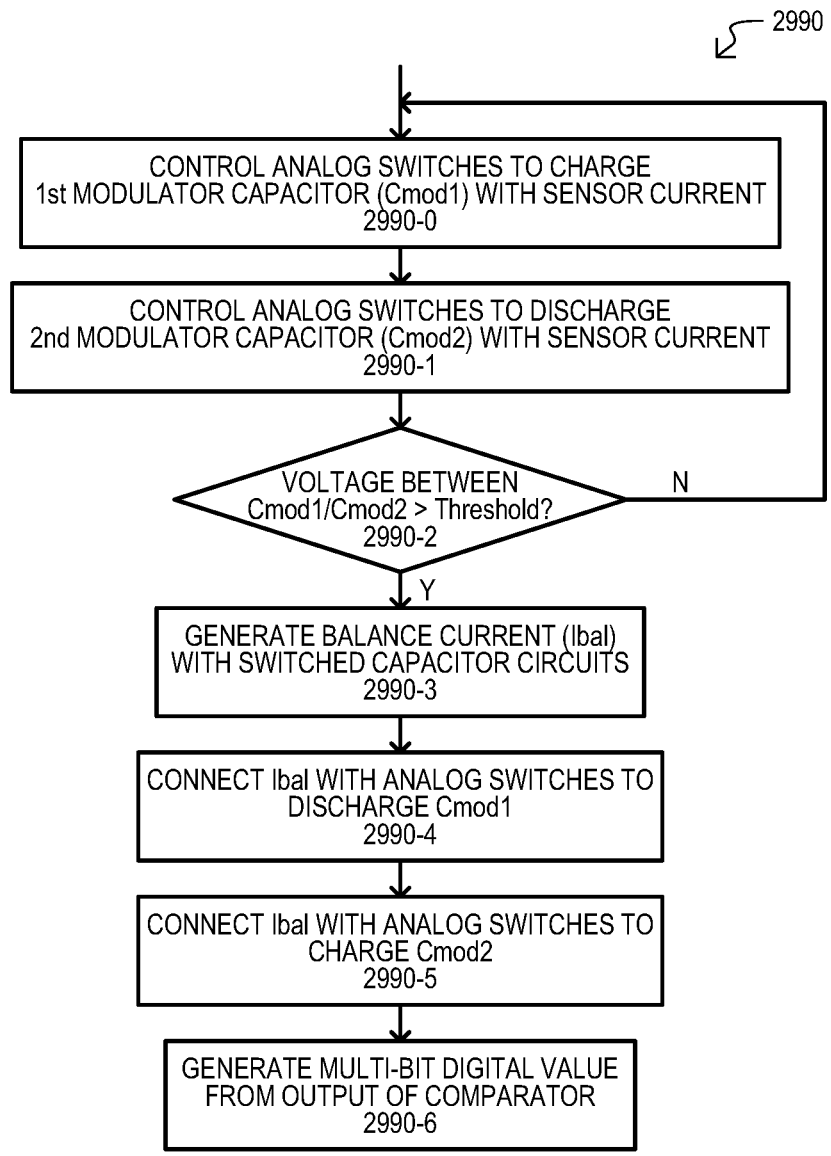
FIG. 29 is a flow diagram of a method according to a further embodiment.
Figure 30A:
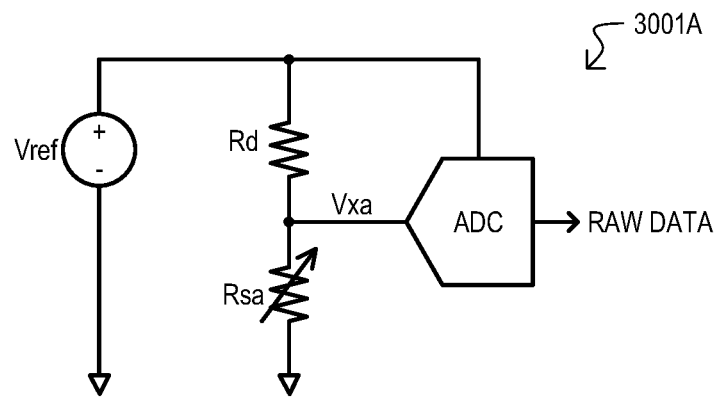
FIGS. 30A and 30B are schematic diagrams of conventional ADC systems.
Figure 30B:
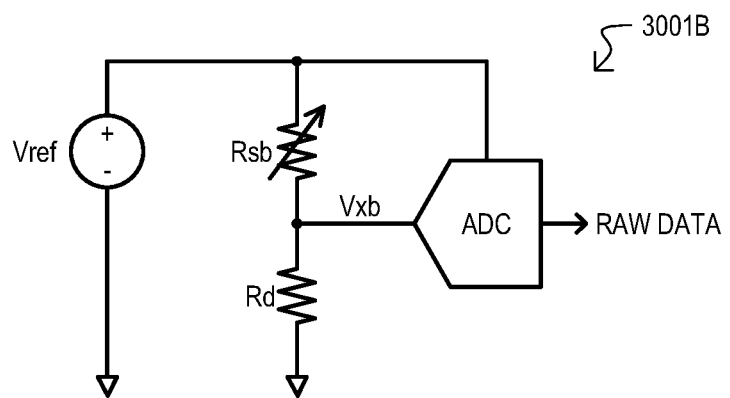

FIG. 29 is a flow diagram of another method 2990 according to a further embodiment. A method 2990 can include controlling analog switches to charge a first modulation capacitance (Cmod1) with a sensor current 2990-0. Analog switches can also be controlled to discharge a second modulation capacitance (Cmod2) with the sensor current 2990-1. Such an action can generate differential voltage between Cmod1 and a Cmod2.

A method 2990 can then determine if a voltage between Vcmod1 and Vcmod2 exceeds a threshold 2990-2. In some embodiments, such an action can include determining if a voltage difference between and Cmod1/Cmod2 exceeds the offset voltage of the comparator. However, alternate embodiments can include larger thresholds and/or hysteresis. If a threshold is not exceeded (N from 2990-2), a method 2990 can return to 2990-0 (generating a differential voltage between Cmod1 and Cmod2 with Isen).

If a threshold is exceeded (Y form 2990-2), a method 2990 can generate Ibal with switched capacitor circuits 2990-3. Such an action can include any of those described herein or equivalents. Ibal can be connected with analog switches to discharge Cmod1 2990-4. In addition, Ibal can be connected with analog switches to charge Cmod2 2990-5. Such an action can work against Isen, reducing a voltage difference between Cmod1 and Cmod2 created by Isen.

A multi-bit digital value can be generated from an output of the comparator 2990-6. Such an action can take the form of any of those described herein, or equivalents.

According to embodiments, a sensor system can include an analog-front-end compatible with various sensor type that is robust, high-performance, low-cost, low-power and low-area, relative to conventional approaches. Embodiments can enjoy use in any or all of resistive, capacitive, inductive and impedance sensing applications.

Resistance sensing applications can include, but are not limited to, temperature sensors, resistive force sensors, pressure sensors, photo-resistors, variable and adjusted resistor, resistive touchpad and button sensor. Unlike conventional systems, embodiments can be configured into a C-ADC, and not require a dedicated voltage ADC.

Embodiments can include photoelectric and/or pyroelectric sensing systems, including but not limited to: optical proximity detectors, motion detectors, and light-intensity sensing systems.

According to embodiments, a same architecture can be configured to operate with diverse sensor type, including microelectromechanical sensors, electret devices (e.g., microphones), piezoelectric sensors.

Advantageously, a same sensing architecture can be utilized for numerous different sensor types, or be deployed as a multi-sensor system (i.e., a system that uses multiple sensors of different types). This is in sharp contrast to conventional approaches which can have dedicated sensor circuits for each sensor type.

Advantageously, embodiments can modulate sensor and/or balance currents for a linear resistance-to-code response.

Embodiments can advantageously provide multi-sensing capabilities with a single integrated circuit (IC) device, including a mixed signal SoC formed with a same IC substrate. This is in contrast to conventional systems which can include a dedicated IC device for each sensor, which can be more costly, require greater area, and greater design complexity.

In some embodiments, sensor currents can be received directly by a C-ADC circuit. This is in contrast to conventional systems which can include an intermediate voltage generation step (e.g., active integrators, TIA, passive circuit elements). In this way, embodiments can be less costly, less complex, and easier to deploy than conventional systems.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A method, comprising:
configuring switch control circuits to generate a plurality of switch control signals based on configuration data in response to an output of an analog comparator circuit and a modulation clock signal;
configuring a plurality of first analog switches of a program balance current generator to modulate at least one balance current based on at least a first control signal and a second control signal of the plurality of switch control signals, wherein the first control signal and the second control signal have duty cycles that do not overlap;
configuring a second analog switch of the program balance current generator to couple the plurality of first analog switches to a first input of the analog comparator circuit based on a third control signal of the plurality of switch control signals, wherein the second analog switch is configured to modulate a sensor current received at the first input of the analog comparator circuit;
offsetting, responsive to a determination that a voltage at the first input of the analog comparator circuit meets a voltage threshold, the sensor current with the balance current; and
generating a multi-bit digital value from at least a bit stream output by the analog comparator circuit corresponding to the sensor current.

2. The method of claim 1, wherein:
the programmable balance current generator includes a current source circuit in series with the second analog switch, wherein the current source circuit comprises the plurality of first analog switches.

3. The method of claim 1, further comprising:
modulating the sensor current by operating the second analog switch in series with a sensor input in response to the third control signal of the plurality of switch control signals.

4. The method of claim 1, wherein the balance current generator comprises a switched capacitation (SC) circuit and wherein generating the at least one balance current further comprises:
coupling, by a first SC analog switch, a first reference capacitor terminal and first power supply node, wherein the first SC analog switch is one of the plurality of first analog switches,
coupling, by a second SC analog switch, the first reference capacitor terminal and a second power supply node, wherein the second SC analog switch is one of the plurality of first analog switches.

5. The method of claim 1, further including:
latching the output of the analog comparator circuit in synchronism with a modulation clock to generate the bit stream output.

6. The method of claim 1, further including:
sourcing the sensor current to a first modulation capacitance coupled to the first input of the analog comparator circuit, and
selectively sourcing the balance current to a second modulation capacitance coupled to a second input of the analog comparator circuit in response to at least the output of the analog comparator; and
in another phase of the sensing operation,
sinking the sensor current from the second first modulation capacitance, and selectively sinking the balance current from the first modulation capacitance in response to at least the output of the analog comparator.

7. The method of claim 6, further including:
generating the sensor current with sensor device that includes a resistance that varies in response to predetermined conditions.

8. The method of claim 1, further including:
generating the sensor current with sensor device that includes a resistance that varies in response to predetermined conditions.

9. A device, comprising:
a plurality of external connections, including a first sensor connection configured to source a sensor current from a sensor device; and
analog circuits formed with a substrate, including at least an analog comparator circuit and a plurality of analog switches, the analog circuits configurable to:
couple the first sensor connection to a first input of the analog comparator circuit;
generate at least one balance current with a balance current generator, wherein the balance current generator comprises a plurality of first analog switches that modulate the balance current; and
couple, with a second analog switch, the balance current generator to the first input of the analog comparator circuit; and
digital circuits formed with the substrate and configurable into at least:
switch control logic that generates a plurality of switch control signals in response to an output of the analog comparator circuit and a modulation clock signal, wherein a first switch control signal controls at least a first analog switch of the plurality of first analog switches, a second switch control signal controls at least a second analog switch of the plurality of first analog switches, and at least one of the first switch control signal and the second switch control signal controls the second analog switch; and
signal processing circuits configured to generate a multi-bit digital value from at least a bit stream output by the analog comparator circuit, the multi-bit digital value corresponding to the sensor current.

10. The device of claim 9, wherein:
the analog comparator circuit has a second input coupled to a reference voltage;
the sensor current is coupled to flow in a first direction with respect to the first input of the analog comparator circuit; and
the at least one balance current flows in a second direction with respect to the first input of the analog comparator circuit.

11. The device of claim 9, wherein:
the external connections further include a second sensor connection configured to sink the sensor current to the sensor device;
the analog circuit are configurable to couple the second sensor connection to a second input of the analog comparator circuit.

12. The device of claim 9, wherein:
the analog circuits are configurable into a differential front end that includes
a first balance analog switch configured to couple the balance current to the first input of the analog comparator,
a second balance analog switch configured to couple the balance current to a second input of the analog comparator,
a first sensor analog switch configured to couple toe sensor current to the first input of the analog comparator, and
a second sensor analog switch configured to couple the sensor current to the second input of the analog comparator.

13. The device of claim 9, wherein:
the switch control logic includes a flip-flop circuit clocked with the modulation clock signal and comprises an input coupled to the output of the analog comparator circuit, and an output that provides a bit stream corresponding to the sensor current.

14. The device of claim 9, wherein:
the first switch control signal and the second switch control signal transition between first and second levels, wherein the first levels of the first switch control signal do not overlap the first levels of the second switch control signal in time.

15. The device of claim 14, wherein the balance current generator comprises a switch capacitor (SC) circuit that includes:
a first SC switch of the plurality of first analog switches coupled between a first reference capacitance node and a first power supply node, and coupled to receive the first switch control signal; and
a second SC switch of the plurality of first analog switches coupled between the first reference capacitance node and a second power supply node, and coupled to receive the second switch control signal.

16. A system, comprising:
a sensor configured to generate a sensor current; and
a configurable mixed signal integrated circuit (IC) device comprising:
a plurality of device connections, including a first connection coupled to receive the sensor current;
analog circuits including:
at least one analog comparator circuit coupled to the first connection;
a balance current generator configured to provide at least one balance current, the balance current comprising a first plurality of analog switches configured to modulate the balance current and a second analog switch to couple the balance current generator to the first input of the at least one analog comparator circuit, wherein the second analog switch is configured to modulate the sensor current with a first balance current of the at least one balance current; and
digital circuits including:
a switch signal generator that generates a plurality of switch control signals in response to an output of the at least one analog comparator circuit and a modulation clock signal, wherein a first switch control signal controls at least a first analog switch of the plurality of first analog switches, a second switch control signal controls at least a second analog switch of the plurality of first analog switches, and a third switch control signal controls the second analog switch; and
digital processing circuits configured to generate a multi-bit conversion value corresponding to the sensor current in response to the output of the at least one analog comparator circuit.

17. The system of claim 16, wherein:

the sensor includes a sensor element having at least one property that varies the sensor current in response to a sensed condition, and the at least one property is selected from a group of: a resistance, a capacitance, an inductance, and an impedance.

18. The system of claim 17, further including:

a second modulation capacitor;

the device connections including a third connection coupled to the second modulation capacitor;

the plurality of analog switches are further configured to in a first phase of a sense operation, source the sensor current to the first modulation capacitor; and selectively source the balance current to the second modulation capacitor in response to the output of the at least one analog comparator; and in a second phase of the sense operation, sink the sensor current from the second modulation capacitor; and selectively sink the balance current from the first modulation capacitor in response to the output of the at least one analog comparator.

19. The system of claim 16, further comprising:

a first modulation capacitor;

a second connection of the device connections coupled to the first modulation capacitor; and a third analog switch configured to couple the second connection to the first input of the at least one analog comparator circuit, wherein the first balance current has a flow opposite to that of the sensor current at the first input of the at least one analog comparator circuit.

20. The system of claim 16, wherein:

the first switch control signal and the second switch control signal are configured to transition between first and second levels; and the first levels of the first switch control signal do not overlap the first levels of the second switch control signal in time.

21. The system of claim 16, wherein:

the digital processing circuits comprise a digital decimator circuit.

* * * * *